US008611974B2

(12) United States Patent
Maibaum et al.

(10) Patent No.: US 8,611,974 B2
(45) Date of Patent: Dec. 17, 2013

(54) SYSTEMS, METHODS AND APPARATUS FOR SUPERCONDUCTING DEMULTIPLEXER CIRCUITS

(75) Inventors: Felix Maibaum, Braunschweig (DE); Paul I. Bunyk, Vancouver (CA); Thomas Mahon, Vancouver (CA)

(73) Assignee: D-Wave Systems Inc., Burnaby (CA)

( * ) Notice: Subject to any disclaimer, the term of this patent is extended or adjusted under 35 U.S.C. 154(b) by 621 days.

(21) Appl. No.: 12/991,889

(22) PCT Filed: Jun. 2, 2009

(86) PCT No.: PCT/US2009/045976
§ 371 (c)(1),
(2), (4) Date: Nov. 9, 2010

(87) PCT Pub. No.: WO2009/149086
PCT Pub. Date: Dec. 10, 2009

(65) Prior Publication Data
US 2011/0065586 A1 Mar. 17, 2011

Related U.S. Application Data

(60) Provisional application No. 61/058,494, filed on Jun. 3, 2008.

(51) Int. Cl.
*H01L 39/10* (2006.01)
*G11C 11/44* (2006.01)
*G06F 13/00* (2006.01)
*G06F 15/16* (2006.01)

(52) U.S. Cl.
USPC ........... 505/170; 505/190; 505/831; 365/160; 365/162; 341/133; 327/367

(58) Field of Classification Search
USPC ................ 505/170, 190, 831; 365/162, 160; 341/133; 327/367; 326/3–5
See application file for complete search history.

(56) References Cited

U.S. PATENT DOCUMENTS 5,982,219 A * 11/1999 Kirichenko .................... 327/367
6,114,931 A * 9/2000 Gevorgian et al. ........... 333/99 S
(Continued)

FOREIGN PATENT DOCUMENTS

WO 2009/120638 10/2009

OTHER PUBLICATIONS

Maibaum et al., Systems, Methods and Apparatus for Superconducting Demultiplexer Circuits, U.S. Appl. No. 61/058,494, filed Jun. 3, 2008, 66 pages.

(Continued)

*Primary Examiner* — Stanley Silverman
*Assistant Examiner* — Kallambella Vijayakumar
(74) *Attorney, Agent, or Firm* — Seed IP Law Group PLLC

(57) ABSTRACT

A switching cell for a demultiplexer circuit includes a superconducting input signal path, at least two superconducting output signal paths, and transformers located between an intersection node and respective ends of the output signal paths. Flux applied via the transformers can influence which direction a signal propagates. The switching cell may also include power input nodes. Switching cells may be arranged in various configurations, for example a binary tree or H-tree. A superconducting inductor ladder circuit can perform a digital-to-analog conversion. Flux storage structures may be used with individual switching cells. Latching qubits may be employed. Buffer rows of switching cells may be used to reduce or eliminate cascade error.

40 Claims, 12 Drawing Sheets

(56) References Cited

U.S. PATENT DOCUMENTS

| | | | |
|---|---|---|---|
| 7,843,209 B2 * | 11/2010 | Berkley | 326/7 |
| 7,876,248 B2 * | 1/2011 | Berkley et al. | 341/133 |
| 8,035,540 B2 * | 10/2011 | Berkley et al. | 341/133 |
| 2003/0016069 A1 * | 1/2003 | Furuta et al. | 327/367 |
| 2005/0047245 A1 * | 3/2005 | Furuta et al. | 365/222 |
| 2006/0225165 A1 | 10/2006 | Maassen van den Brink et al. | 977/933 |
| 2008/0176750 A1 | 7/2008 | Rose et al. | 505/170 |
| 2008/0215850 A1 | 9/2008 | Berkley et al. | 712/1 |
| 2009/0082209 A1 | 3/2009 | Bunyk et al. | 505/190 |
| 2009/0121215 A1 | 5/2009 | Choi | 257/31 |

OTHER PUBLICATIONS

Miller et al., "A Single-Flux-Quantum Demultiplexer," IEEE Transactions on Applied Superconductivity 7(2):2690-2692, 1997.

International Search Report, mailed Dec. 30, 2009, for PCT/CA2009/045976, 3 pages.

Written Opinion, mailed Dec. 30, 2009, for PCT/CA2009/045976, 4 pages.

\* cited by examiner

SYSTEMS, METHODS AND APPARATUS FOR SUPERCONDUCTING DEMULTIPLEXER CIRCUITS

CROSS REFERENCE TO RELATED APPLICATIONS

This application is a U.S. national stage application filed under 35 U.S.C. §371 of International Patent Application PCT/US2009/045976, accorded an international filing date of Jun. 2, 2009 which claims benefit under 35 U.S.C. 119(e) of U.S. Provisional Patent Application Ser. No. 61/058,494, filed Jun. 3, 2008 and entitled "Systems, Methods and Apparatus for Superconducting Demultiplexer Circuits," both of which are incorporated herein by reference in their entirety.

BACKGROUND

Field

The present systems, methods, and apparatus generally relate to scalable superconducting computation, and particularly relate to logarithmic addressing and digital-to-analog conversion in the programming of the elements of a superconducting quantum processor.

Superconducting Qubits

There are many different hardware and software approaches under consideration for use in quantum computers. One hardware approach employs integrated circuits formed of superconducting material, such as aluminum and/or niobium, to define superconducting qubits. Superconducting qubits can be separated into several categories depending on the physical property used to encode information. For example, they may be separated into charge, flux and phase devices. Charge devices store and manipulate information in the charge states of the device; flux devices store and manipulate information in a variable related to the magnetic flux through some part of the device; and phase devices store and manipulate information in a variable related to the difference in superconducting phase between two regions of the phase device.

Many different forms of superconducting flux qubits have been implemented in the art, but all successful implementations generally include a superconducting loop (i.e., a "qubit loop") that is interrupted by at least one Josephson junction. Some embodiments implement multiple Josephson junctions connected either in series or in parallel (i.e., a compound Josephson junction) and some embodiments implement multiple superconducting loops.

Quantum Processor

A computer processor may take the form of an analog processor, for instance a quantum processor such as a superconducting quantum processor. A superconducting quantum processor may include a number of qubits and associated local bias devices, for instance two or more superconducting qubits. Further detail and embodiments of exemplary quantum processors that may be used in conjunction with the present systems, methods, and apparatus are described in US Patent Publication No. 2006-0225165, US Patent Publication 2008-0176750, U.S. patent application Ser. No. 12/266,378, and PCT Patent Application Serial No. PCT/US09/37984.

Regardless of the specific hardware being implemented, managing even a single qubit requires control over a number of parameters. Conventionally, this requirement necessitated outside communication (that is, communication from outside of the processor architecture) with individual qubits. However, since overall processing power increases with the number of qubits in the system, high capacity processors that exceed the abilities of conventional supercomputers must manage a large number of qubits and thus the conventional approach of employing outside control over multiple parameters on individual qubits requires a complicated system for programming qubit parameters.

Thus, the scalability of quantum processors is limited by the complexity of the qubit control system and there remains a need in the art for a scalable qubit control system.

Superconducting Processor

A computer processor may take the form of a superconducting processor, where the superconducting processor may not be a quantum processor in the traditional sense. For instance, some embodiments of a superconducting processor may not focus on quantum effects such as quantum tunneling, superposition, and entanglement but may rather operate by emphasizing different principles, such as for example the principles that govern the operation of classical computer processors. However, there may still be certain advantages to the implementation of such superconducting processors. Due to their natural physical properties, superconducting processors in general may be capable of higher switching speeds and shorter computation times than non-superconducting processors, and therefore it may be more practical to solve certain problems on superconducting processors.

BRIEF SUMMARY

At least one embodiment may be summarized as a superconducting demultiplexer including a plurality of switching cells that includes a lead switching cell, a first set of switching cells, and a second set of switching cells, wherein each switching cell in the plurality of switching cells includes a signal input end, a first signal output end and a second signal output end; a first Josephson transmission line having a first end and a second end, wherein the first end of the first Josephson transmission line is coupled to the signal input end; a second Josephson transmission line having a first end and a second end, wherein the first end of the second Josephson transmission line is coupled to the first signal output end and the second end of the second Josephson transmission line is coupled to the second output end, and wherein the second end of the first Josephson transmission line is coupled to the second Josephson transmission line at an intersection node; and a flux bias line that is positioned to inductively couple signals to both a first node and a second node on the second Josephson transmission line, wherein the first node on the second Josephson transmission line is located in between the intersection node and the first output end, and wherein the second node on the second Josephson transmission line is located in between the intersection node and the second output end; wherein the input end of the lead switching cell is configured to receive signals from an input signal source, the first output end of the lead switching cell is coupled to the input end of a first switching cell from the first set of switching cells, the second output end of the lead switching cell is coupled to the input end of a second switching cell from the first set of switching cells, the first and the second output ends of both the first and the second switching cells in the first set of switching cells are each coupled to the input end of another respective switching cell in the first set of switching cells, and wherein the input end of each switching cell in the second set of switching cells is coupled to a respective output end of a switching cell in the first set of switching cells. At least one output end of at least one switching cell in the second set of switching cells may be configured to couple to a programmable device. The programmable device may include an element of a superconducting processor. The programmable device may include an element of a superconducting quantum processor. The programmable device may be selected from the group consisting of: a superconducting flux qubit, a superconducting phase qubit, a superconducting charge qubit, a superconducting hybrid qubit, and a superconducting qubit coupler.

The superconducting demultiplexer may further include a set of flux storage structures, wherein each flux storage structure is coupled to a respective output end of at least one switching cell in the second set of switching cells, and wherein each flux storage structure comprises: a third Josephson transmission line that includes a first end and a second end, the first end coupled to an output end of at least one switching cell in the second set of switching cells; a storage inductor coupled in series with the third Josephson transmission line; a compound Josephson junction that interrupts the third Josephson transmission line at a node that is located in between the first end and the storage inductor; and a reset line that is positioned to controllably inductively couple signals to the compound Josephson junction. At least one storage inductor may be positioned to inductively couple signals to at least one programmable device. At least one storage inductor may be positioned to inductively couple signals to at least one superconducting loop in a superconducting inductor ladder circuit. At least two storage inductors may each be respectively positioned to inductively couple signals to respective ones of at least two loops in a superconducting inductor ladder circuit. The superconducting inductor ladder circuit may be positioned to couple signals to at least one programmable device. The at least one programmable device may include an element of a superconducting processor. The at least one programmable device may include an element of a superconducting quantum processor. The at least one programmable device may be selected from the group consisting of: a superconducting flux qubit, a superconducting phase qubit, a superconducting charge qubit, a superconducting hybrid qubit, and a superconducting qubit coupler. The same flux bias line may be positioned to controllably inductively couple signals to at least two switching cells.

At least one embodiment may be summarized as a superconducting demultiplexer including a plurality of latching qubits that includes a plurality of latching qubits that includes a lead latching qubit, a first set of latching qubits, and a second set of latching qubits, wherein each latching qubit in the plurality of latching qubits includes a qubit loop formed by a loop of material that is superconducting below a critical temperature, and a compound Josephson junction that interrupts the qubit loop, the compound Josephson junction comprising a loop of material that is superconducting below a critical temperature that is interrupted by at least two Josephson junctions; a first set of clock signal lines; a second set of clock signal lines; and at least one control line, wherein each latching qubit in the first and the second sets of latching qubits is positioned to receive signals by inductive coupling to a control line; wherein the lead latching qubit is positioned to receive signals from an input signal source, a first latching qubit in the first set of latching qubits is positioned to inductively couple to the qubit loop of the lead latching qubit and a first clock signal line from the first set of clock signal lines is positioned to controllably inductively couple to the compound Josephson junction of the first latching qubit in the first set of latching qubits, a second latching qubit in the first set of latching qubits is positioned to inductively couple to the qubit loop of the lead latching qubit and a first clock signal line from the second set of clock signal lines is positioned to controllably inductively couple to the compound Josephson junction of the second latching qubit in the first set of latching qubits; and wherein the qubit loop of each latching qubit in the first set of latching qubits is respectively positioned to inductively couple to the qubit loop of three other latching qubits in the plurality of latching qubits, the compound Josephson junction of a first proportion of latching qubits from the first set of latching qubits is positioned to inductively couple to a clock signal line from the first set of clock signal lines, the compound Josephson junction of a second proportion of latching qubits from the first set of latching qubits is positioned to inductively couple to a clock signal line from the second set of clock signal lines, the qubit loop of each latching qubit in the second set of latching qubits is positioned to inductively couple to the qubit loop of a respective one of the latching qubits in the first set of latching qubits, the compound Josephson junction of a first proportion of latching qubits in the second set of latching qubits is positioned to inductively couple to a clock signal line from the first set of clock signal lines, and the compound Josephson junction of a second proportion of latching qubits in the second set of latching qubits is positioned to inductively couple to a clock signal line from the second set of clock signal lines. The qubit loop of at least one latching qubit in the second set of latching qubits may be configured to couple to a programmable device. The programmable device may include an element of a superconducting processor. The programmable device may include an element of a superconducting quantum processor. The programmable device may be selected from the group consisting of: a superconducting flux qubit, a superconducting phase qubit, a superconducting charge qubit, a superconducting hybrid qubit, and a superconducting qubit coupler. At least two latching qubits in the first set of latching qubits may be positioned to inductively couple to a same one of the clock signal lines from the first set of clock signal lines. At least two latching qubits in the first set of latching qubits may be positioned to inductively couple to a same one of the clock signal lines from the second set of clock signal lines. The first proportion of latching qubits in the first set of latching qubits may be approximately fifty percent, the second proportion of latching qubits in the first set of latching qubits may be approximately fifty percent, the first proportion of latching qubits in the second set of latching qubits may be approximately fifty percent, and the second proportion of latching qubits in the second set of latching qubits may be approximately fifty percent. The qubit loop of at least one latching qubit in the second set of latching qubits may be positioned to inductively couple to at least one superconducting loop in a superconducting inductor ladder circuit. The qubit loops of at least two respective latching qubits in the second set of latching qubits may be positioned to each inductively couple to a respective one of at least two superconducting loops in a superconducting inductor ladder circuit. The superconducting inductor ladder circuit may be positioned to couple signals to at least one programmable device. At least one programmable device may include an element of a superconducting processor. At least one programmable device may include an element of a superconducting quantum processor. At least one programmable device may be selected from the group consisting of: a superconducting flux qubit, a superconducting phase qubit, a superconducting charge qubit, a superconducting hybrid qubit, and a superconducting qubit coupler.

At least one embodiment may be summarized as a demultiplexer circuit including a first switching cell including an input end and two output ends; a first set of additional switching cells, wherein each switching cell in the first set of additional switching cells includes an input end and two output ends and wherein the first set of additional switching cells includes at least one buffer cell; and an input signal source that is configured to controllably couple input signals to the first switching cell; wherein the first set of additional switching cells is arranged to substantially form a binary tree such that each output end of each switching cell couples to a respective input end of another switching cell and wherein each input end of each switching cell receives at least one input from at least one output of at least one other switching cell, and wherein the input end of the at least one buffer cell receives one respective output end from each of at least two respective switching cells and the two output ends of the at least one buffer cell each couple to the input end of a respective switching cell. The first set of additional switching cells may be arranged in a set of rows such that at least one row includes at least two buffer cells. The switching cells may be superconducting devices.

The demultiplexer may further include a second set of additional switching cells that each include an input end and two output ends, wherein the input end of each switching cell in the second set of additional switching cells is coupled to at least one respective output end of a respective switching cell from the first set of additional switching cells and at least one output end of at least one switching cell in the second set of additional switching cells is configured to couple to a programmable device. The programmable device may include an element of a superconducting processor. The programmable device may include an element of a superconducting quantum processor. The programmable device may be selected from the group consisting of: a superconducting flux qubit, a superconducting phase qubit, a superconducting charge qubit, a superconducting hybrid qubit, and a superconducting qubit coupler.

At least one embodiment may be summarized as a superconducting demultiplexer circuit including a network of Josephson transmission lines providing a plurality of superconducting signal paths, wherein each superconducting signal path includes an input end and an output end such that each superconducting signal path shares the same input end and the output end of each superconducting signal path includes a respective compound Josephson junction and a respective superconducting inductor, and wherein each superconducting signal path is positioned to receive control signals by inductive coupling to a plurality of flux bias lines. At least one superconducting inductor may be positioned to inductively couple to at least one programmable device. At least one superconducting inductor may be positioned to inductively couple to a superconducting loop in a superconducting inductor ladder circuit. Each superconducting inductor may be positioned to inductively couple to a respective one of the superconducting loops in at least one superconducting inductor ladder circuit.

At least one embodiment may be summarized as a superconducting demultiplexer circuit including a binary tree arrangement of superconducting latching qubits wherein each superconducting latching qubit comprises a qubit loop formed by a loop of superconducting material and a compound Josephson junction that interrupts the qubit loop, the compound Josephson junction including a closed loop of superconducting material interrupted by at least two Josephson junctions, wherein the qubit loop and the compound Josephson junction form a closed superconducting current path, and wherein the qubit loop of each superconducting latching qubit is positioned to inductively couple at least one input signal and at least two output signals and the compound Josephson junction of each superconducting latching qubit is positioned to receive clock signals by inductive coupling to a clock signal line; and at least one control signal line that is positioned to inductively couple control signals to the respective qubit loops of at least two of the superconducting latching qubits.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

DETAILED DESCRIPTION

Figure 1:
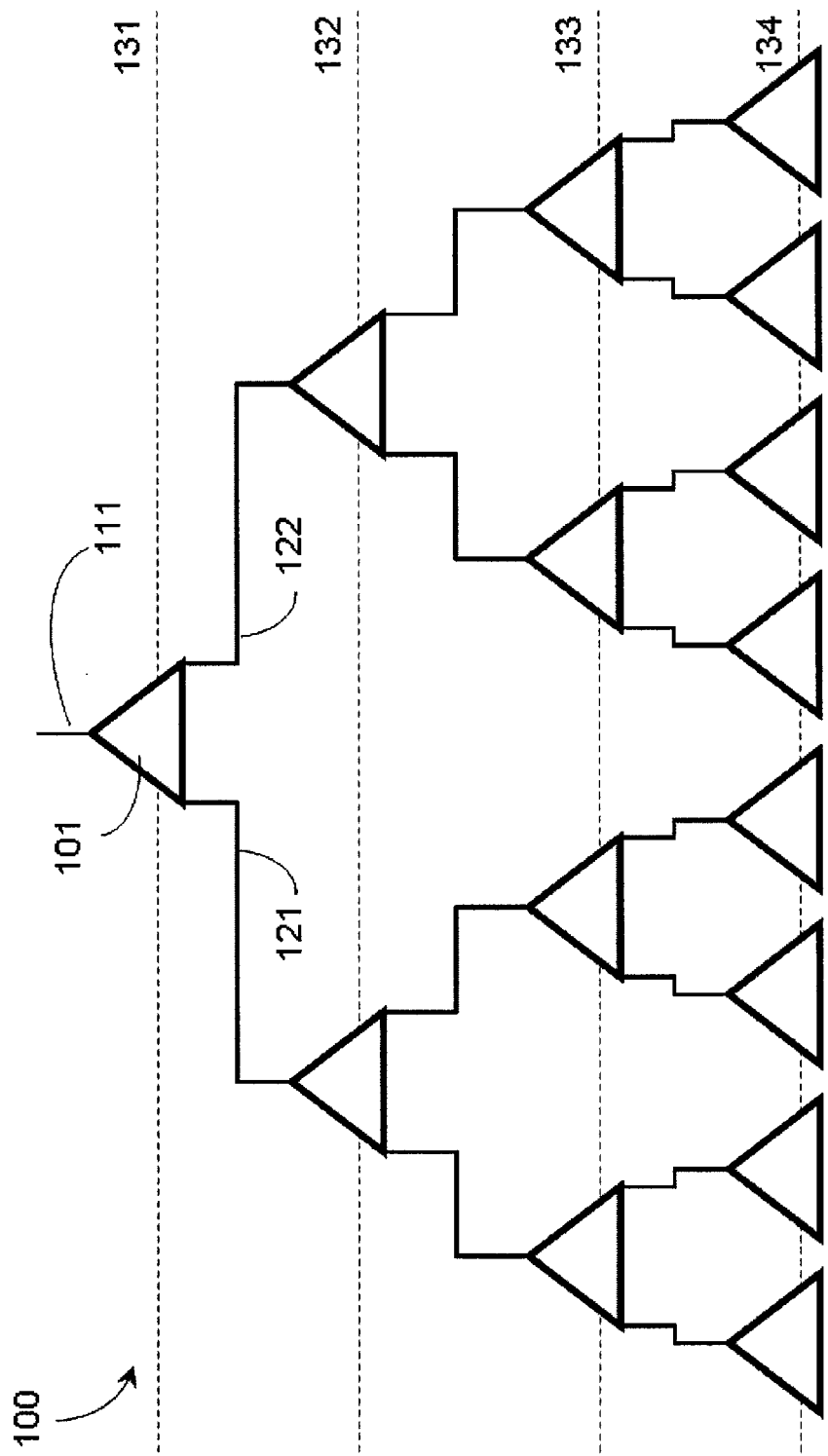
FIG. 1 is schematic diagram of an exemplary demultiplexer circuit.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with quantum processors, such as quantum devices, coupling devices, and control systems including microprocessors and drive circuitry have not been shown or described in detail to avoid unnecessarily obscuring descriptions of the embodiments. Throughout this specification and the appended claims, the words "element" and "elements" are used to encapsulate, but are not limited to, all such structures, systems and devices associated with quantum processors, as well as their related programmable parameters.

Unless the context requires otherwise, throughout the specification and claims which follow, the word "comprise" and variations thereof, such as, "comprises" and "comprising" are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a", "an", and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

The various embodiments described herein provide scalable systems, methods and apparatus for local programming of the elements of a superconducting processor, such as a superconducting quantum processor. Throughout this specification and the appended claims, the term "quantum processor" is used to describe a system that comprises at least two qubits and at least one device, such as a qubit coupler, for communicating information between at least two qubits. Some embodiments of a quantum processor may include tens, hundreds, thousands, or even millions of qubits and qubit couplers. In some embodiments, the components of a quantum processor may be entirely contained within a single structure, such as a superconducting quantum processor chip. In other embodiments, the components of a quantum processor may be distributed over a plurality of structures with communications therebetween.

As previously discussed, managing even a single qubit requires control over a number of parameters. Conventionally, this requirement necessitates outside communication (that is, communication from outside of the processor) with each individual qubit. However, since overall processing power increases with the number of qubits in the system, high capacity processors that exceed the abilities of conventional supercomputers may implement a large number of qubits. Thus, the scalability of a quantum processor is highly dependent on the scalability of the qubit control system. This problem was addressed in US Patent Publication 2008-0215850 where the concept of locally programming the elements of a superconducting quantum processor was introduced. US Patent Publication 2008-0215850 teaches the implementation of superconducting digital-to-analog conversion using, for example, the digital-to-analog converters described in US Patent Publication 2009-0082209. US Patent Publication 2008-0215850 also introduces the idea of implementing a superconducting demultiplexer circuit in programming the elements of a superconducting quantum processor. Some embodiments of superconducting demultiplexer circuits are known in the art (e.g., Miller et al., "A Single-Flux-Quantum Demultiplexer", IEEE transactions on applied superconductivity, Vol. 7, Issue 2, June 1997, pp. 2690-2692). However, the present systems, methods and apparatus provide new designs for superconducting demultiplexer circuits that are well-suited for use with a superconducting quantum processor and, in some embodiments, particularly well-suited for use in conjunction with the principles of superconducting digital-to-analog conversion taught in US Patent Publication 2009-0082209. Those of skill in the art will appreciate that, in some embodiments, all of these devices may be included on the same chip as the elements of a superconducting quantum processor. In other embodiments, these devices may be separate from the chip that includes the elements of the superconducting quantum processor. For example, in some embodiments the devices described herein may be included within a multi-chip module, where at least one chip includes the elements of a superconducting quantum processor.

As is known in the art, a demultiplexer (or "demux") is an electronic device that takes an input signal and directs it to a selected one of a plurality of output paths. This is typically achieved by a set of switching cells where each cell has a first signal input line and first and second signal output lines. In operation, a cell may receive an input signal through its first signal input line and controllably route that signal to either its first or its second signal output line. A plurality of such cells may be arranged in a set of rows to resemble a binary tree, where the number of cells in each successive row is typically twice that of the previous row (i.e., the number of cells in the $(i+1)^{th}$ row is twice the number of cells in the $i^{th}$ row).

Throughout this specification, a layout or arrangement of devices is occasionally described as having a "row" or "rows." Those of skill in the art will appreciate that these terms are used for illustrative purposes only and are not intended to limit the layouts and arrangements of the various embodiments described herein. Those of skill in the art will appreciate that circuit layouts may be adapted to accommodate any spatial design.

FIG. 1 is a schematic diagram of an exemplary demux circuit 100. Demux 100 includes fifteen substantially similar individual switching cells 101 (only one called out in the figure) arranged in four rows 131-134. The first row 131 includes one cell 101 and the number of cells in each successive row is twice that of the previous row. For example, row 132 includes two cells and row 133 includes four cells. Those of skill in the art will appreciate that a demux may include any number of rows and any number of individual switching cells to satisfy the requirements of the specific system in which it is being implemented.

Only one individual switching cell 101 is called out in FIG. 1 to reduce clutter in the Figure, and because each of the fifteen switching cells in demux 100 is substantially similar to cell 101. Thus, all of the descriptions of cell 101 that follow also apply to the other fourteen cells (each represented by a respective triangle) in demux 100.

As previously described, a switching cell 101 includes one signal input line 111 and two signal output lines 121, 122. Each switching cell 101 may also include a control line (not shown), that carriers a control signal to select one of the output lines 121, 122. In the operation of demux 100, switching cell 101 is used to selectively route an input signal from input line 111 to either output line 121 or output line 122. Throughout this specification and the appended claims, the term "lead switching cell" is used to refer to the first switching cell that is configured to couple to the input signal source in a demux circuit. For example, the single switching cell 101 in the first row 131 of demux 100 is referred to as a "lead switching cell." From lead switching cell 101 in row 131, a signal may be routed to a specific cell in row 132, from whence it may be routed to a specific cell in row 133, and so forth. The purpose of the demux circuit, such as demux 100, is to route an input signal from a single input signal line to any one of a plurality of output paths. In some applications, the plurality of output paths may each terminate at a respective programmable device, or a respective programmable portion of at least one device. In accordance with the present systems, methods and apparatus, variations of demux circuits that are particularly well-suited to route signals to the programmable devices of a superconducting processor, such as a superconducting quantum processor, are described.

Throughout this specification and the appended claims, the terms "programmable device" and "programmable devices" are used to describe any of a variety of elements in a quantum processor for which programming is desired. Examples of programmable devices include qubits, qubit couplers, specific components of qubits and qubit couplers, and the like. For example, a superconducting flux qubit may include two components: a qubit loop and a compound Josephson junction, and separate respective data signals may be programmed into each of these components.

Figure 2:
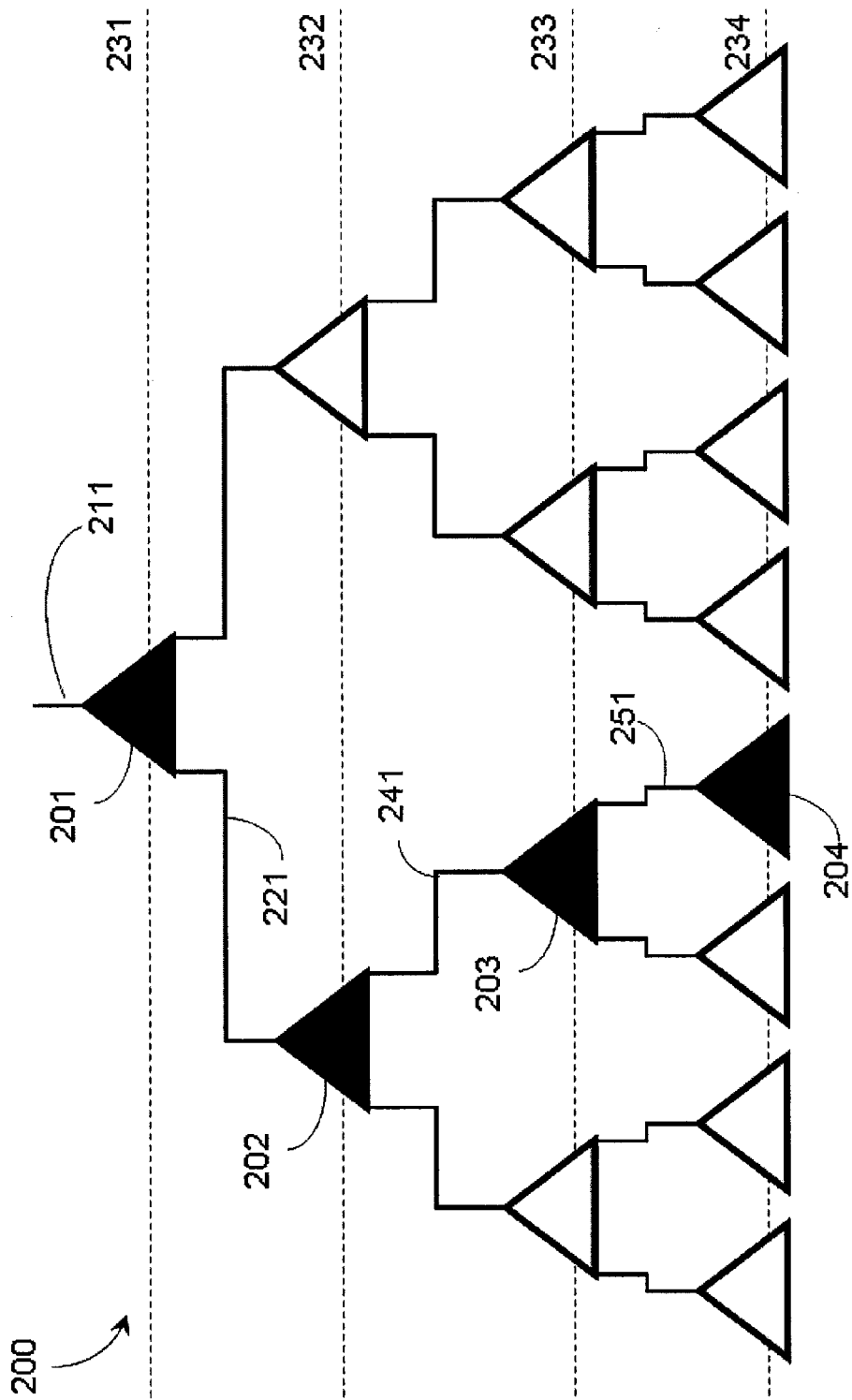
FIG. 2 is an illustrative diagram of a sample operation of an exemplary demultiplexer circuit.

FIG. 2 is an illustrative diagram of a sample operation of an exemplary demux circuit 200. Demux 200 is substantially similar to demux 100 from FIG. 1 and comprises fifteen individual switching cells (201-204, only four called out in the Figure) which are each used to selectively route an input signal along one of two output paths. In this example, an input signal is routed through demux 200 to cell 204 in row 234. Those cells (201-204) that encounter the input signal in this exemplary operation are colored in black in FIG. 2. The input signal enters demux 200 through input signal line 211, where the signal is fed into lead switching cell 201 in row 231. Lead switching cell 201 is used to selectively route the input signal to cell 202 in row 232, where the signal is then selectively routed to cell 203 in row 233. From cell 203, the signal is selectively routed to cell 204 in row 234. In a similar way, demux 200 may be used to route an input signal from lead switching cell 201 in row 231 to any cell in row 234. In typical demux circuits such as demux 200, each cell in the last row (234) is reached by a single and unique combination of cell outputs. From the last row (234) of the demux, the input signal may be administered to a programmable device. In accordance with the present systems, methods and apparatus, such a programmable device may include an element of a superconducting quantum processor.

While the concept of the demux circuit is well known in the art, the present systems, methods and apparatus describe a new demux circuit that is particularly well-suited for use with a superconducting quantum processor. This new demux circuit includes a new device for use as the fundamental switching cell. This device is a single flux quantum ("SFQ") device that incorporates a Josephson transmission line ("JTL") splitter and switches that are inductively coupled to a flux bias line.

Figure 3:
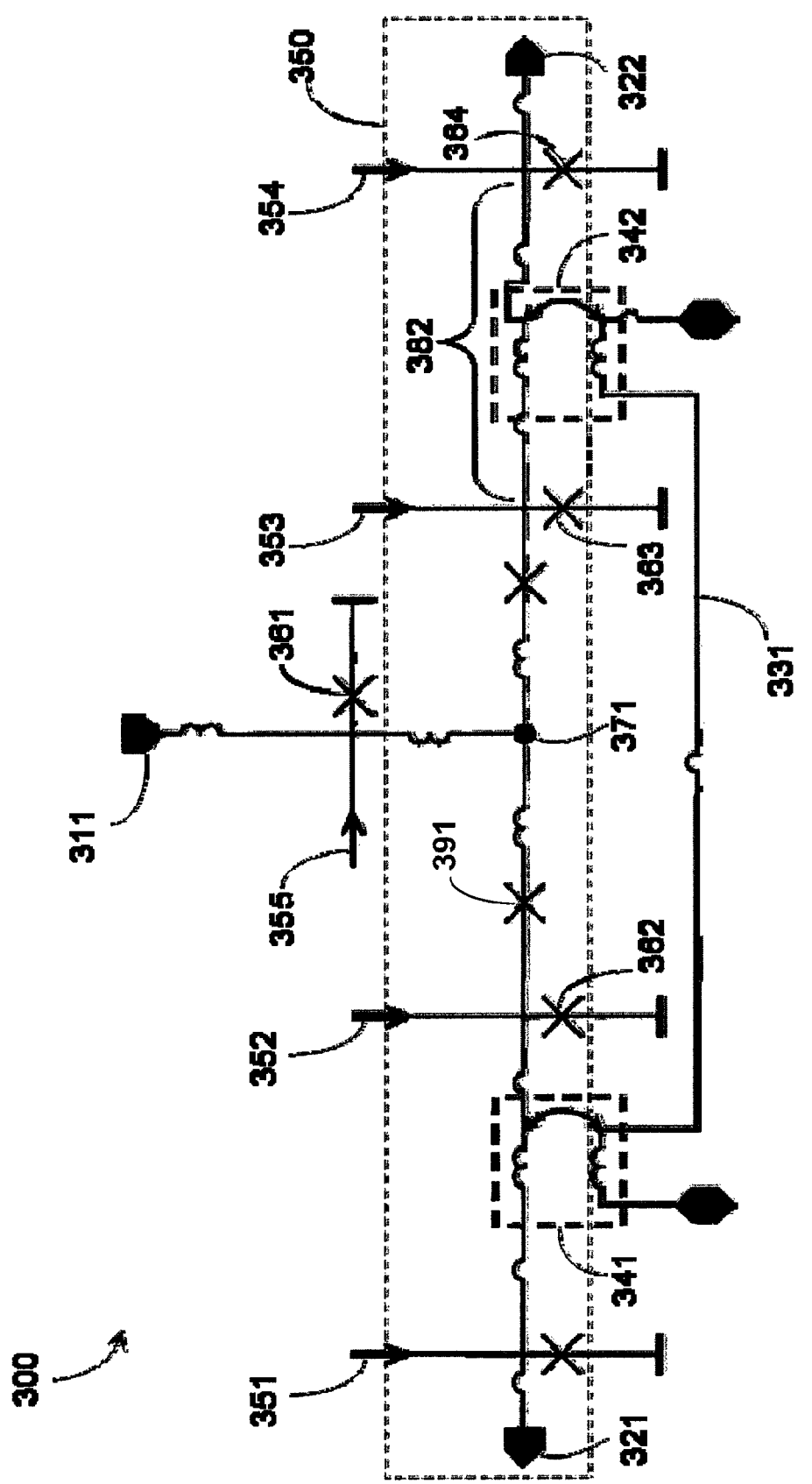
FIG. 3 is a schematic diagram of an embodiment of an individual switching cell for use in a demultiplexer circuit in accordance with the present systems, methods and apparatus.

FIG. 3 is a schematic diagram of an embodiment of an individual switching cell 300 for use in a demux circuit in accordance with the present systems, methods and apparatus. For example, cell 300 may be used as each of the fifteen switching cells 101 in demux 100 from FIG. 1. Switching cell 300 comprises a plurality of superconducting current paths including an input signal line 311 and two output signal paths 321, 322. Those of skill in the art will appreciate that these superconducting current paths may be made of a material, such as niobium or aluminum, that is superconducting below a critical temperature. As illustrated in FIG. 3, the superconducting current path that communicates between outputs 321 and 322 is substantially similar to a JTL and is referred to herein as JTL 350. JTL 350 is inductively coupled to a flux bias line 331 in at least two locations, represented by transformers 341 and 342 in FIG. 3. Input signal path 311 intersects JTL 350 at a point in between transformers 341 and 342 such that flux bias line 331 may influence whether an input signal travels from input 311 to output 321 or from input 311 to output 322.

As illustrated in FIG. 3, switching cell 300 also includes five power input nodes 351-355. Four of these power input nodes 351-354 are configured to deliver power to JTL 350 and one of these power input nodes 355 is configured to deliver power to input signal path 311. However, those of skill in the art will appreciate that a different number and/or a different arrangement of power input nodes may be used in alternative embodiments of switching cell 300.

The operation of a JTL is well understood in the art. This device is typically used to propagate an SFQ signal in between two points, where the propagation typically involves the regeneration of at least one magnetic flux quantum. JTL 350 is used in this way in cell 300. In the operation of cell 300, an input signal may enter switching cell 300 from input signal path 311, causing Josephson junction 361 to release an output pulse. This signal propagates to intersection node 371 in JTL 350, where the input signal is split such that at least a portion of the input signal travels in the direction of output 321 (left in FIG. 3) and at least a portion of the input signal travels in the direction of output 322 (right in FIG. 3). The portion of the input signal that travels in the direction of output 321 is insufficient, on its own, to switch Josephson junction 362. Similarly, the portion of the input signal that travels in the direction of output 322 is insufficient, on its own, to switch Josephson junction 363. However, when a current is passed through flux bias line 331, respective flux signals are inductively coupled from flux bias line 331 to JTL 350 through transformers 341 and 342. Flux bias line 331 may be used to couple additional current into JTL 350 and thereby influence in which direction the input signal propagates. Thus, flux bias line 331 serves as a control line or input to the switching cell 300. For example, when flux bias line 331 is activated with a current traveling to the right in FIG. 3 (that is, towards output 322 of switching cell 300), the inductive coupling between flux bias line 331 and JTL 350 at transformer 342 induces a current traveling to the left in JTL 350 at transformer 342. This induced current adds to the portion of the input signal that is routed through Josephson junction 363 and causes Josephson junction 363 to switch. When this happens, the total current in the portion 382 of JTL 350 in between Josephson junctions 363 and 364 is large enough to switch Josephson junction 364 and produce an output pulse that exits switching cell 300 at output 322.

In this same example, at the other end (i.e., the 321 output end) of switching cell 300 the inductive coupling between flux bias line 331 and JTL 350 at transformer 341 induces a current traveling to the left in JTL 350 at transformer 341. This induced current subtracts from the portion of the input signal that is routed through Josephson junction 362 and therefore Josephson junction 362 does not switch. The portion of the input signal travelling in the direction of output 321 does not propagate through to output 321 when the flux bias line 331 carries a right-going current (with respect to the orientation of FIG. 3); rather, Josephson junction 391 switches instead to release a single flux quantum.

By mechanisms similar to those described above, switching cell 300 may also be used to route an input signal from input 311 to output 321 by applying a leftward current (i.e., towards output 321 in FIG. 3) through flux bias line 331. Thus, the direction of the current (e.g., positive or negative current) through flux bias line 331 may be used to selectively route an input signal from input 311 to either output 321 or output 322. In some embodiments, current of a first direction in flux bias line 331 enables switching cell 300 to route the input signal from input 311 to output 321 and current of a second direction in flux bias line 331 enables switching cell 300 to route the input signal from input 311 to output 322.

The application of positive and negative supply currents in SFQ circuitry has been seen in the art for testing purposes. In the present systems, methods and apparatus, embodiments of SFQ circuits are described in which both positive and negative supply currents may be applied as a functional feature of the system. Furthermore, the various embodiments described herein may be used with positive or negative power through power input nodes 351-355 together with positive or negative input signals through input 311 to administer positive or negative flux quanta through switching cell 300.

In accordance with the present systems, methods and apparatus, a plurality of individual switching cell structures 300 may be arranged to form a demux circuit similar to demux 100 from FIG. 1. The binary tree-type arrangement of FIG. 1 may be achieved by connecting each of the two outputs of each switching cell 300 to respective ones of the inputs of two other switching cells 300. A plurality of switching cells 300 may therefore be arranged in a set of rows, where the number of switching cells in the $(i+1)^{th}$ row is twice the number of cells in the $i^{th}$ row. Furthermore, all switching cells 300 in the same row may be coupled to the same flux bias line 331 such that the number of flux bias lines required is equal to the number of rows in the demux. In this way, a plurality of switching cells 300 may be interconnected to realize a full demux circuit that is highly scalable because it requires very few control lines to operate. Such a demux is well-suited for use with a superconducting quantum processor.

In alternative embodiments, at least two switching cells that are respectively positioned in different rows may both be coupled to the same flux bias line. Those of skill in the art will appreciate that many alternative geometrical and/or coupling arrangements may be implemented to provide a plurality of cells wherein each cell is controlled by a unique combination of signals.

In some embodiments of the present systems, methods and apparatus, a demux circuit may be used to locally route control signals to the elements of a superconducting quantum processor. A major advantage of the demux circuit is that the number of lines needed to program N elements includes one input line plus $\log_2$ N flux bias lines 331. The signals routed by a demux circuit are inherently digital in that each signal is effectively "on" or "off" with little or no information being related to the signal magnitude. In some embodiments, it may be desirable to convert the digital output of a demux circuit to analog form before coupling the signal(s) to the element(s) of a superconducting quantum processor. This digital-to-analog conversion may be achieved using, for example, a superconducting inductor ladder circuit, the full details of which are described in US Patent Publication 2009-0082209. A brief description of this device is now provided.

In classical electrical circuits, a common way to achieve digital-to-analog conversion is through a circuit known as a "resistor ladder" or "R-2R ladder." Such circuits rely on the principles of the "voltage-divider" and are very well established in the art. The superconducting inductor ladder circuit is a superconducting analogue to the classical resistor ladder. A superconducting inductor ladder circuit ("ladder") functions by receiving a multi-bit digital signal, combining the individual bits of the multi-bit digital signal into an analog signal, and administering the analog signal to, for example, at least one programmable device. The ladder may receive and administer signals in the form of magnetic flux quanta.

Figure 4:
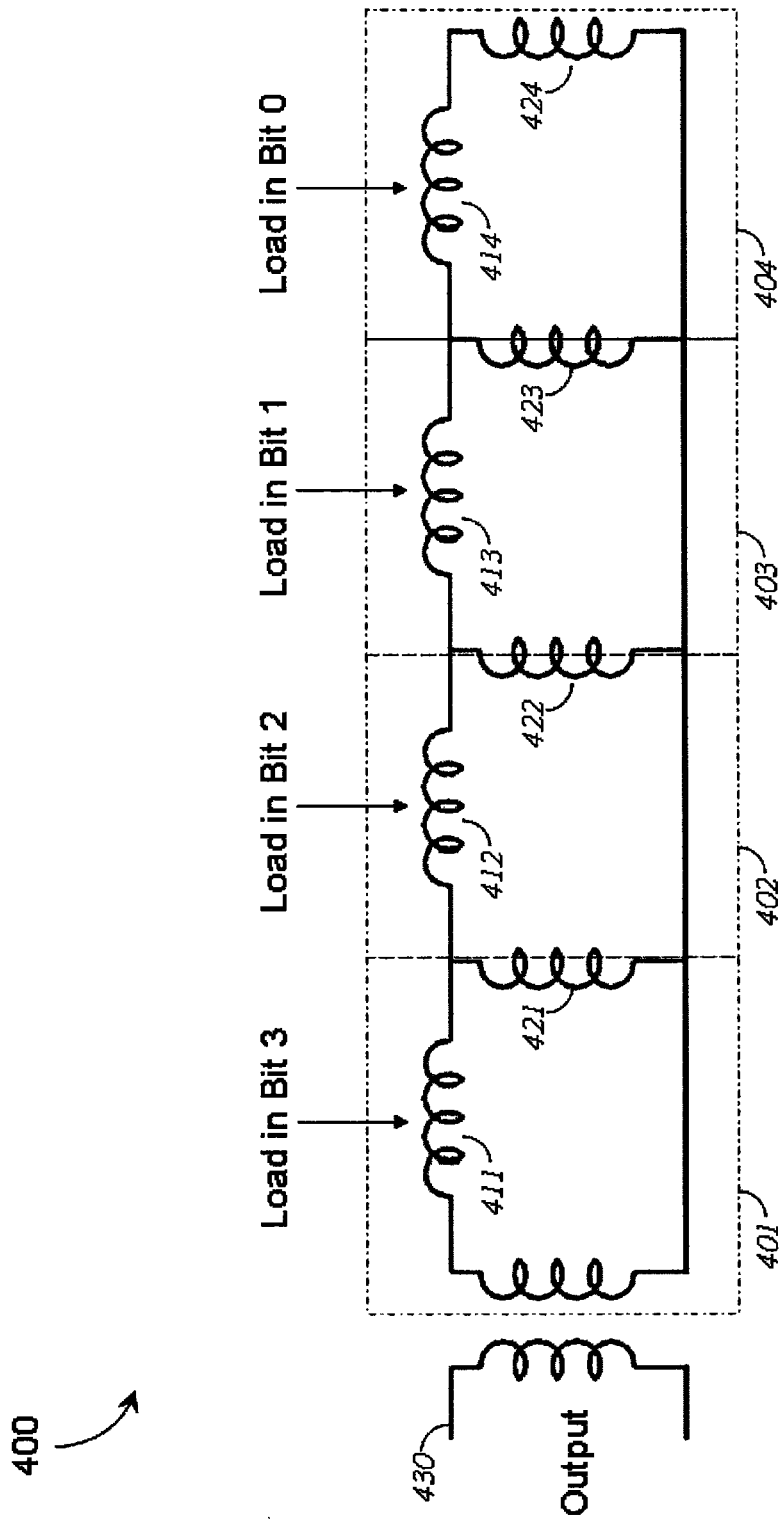
FIG. 4 is a schematic diagram of a superconducting inductor ladder circuit according to one illustrated embodiment.

FIG. 4 is a schematic diagram of a ladder 400 according to one illustrated embodiment. As drawn, ladder 400 comprises four superconducting loops (indicated by broken line boxes) 401-404, connected in parallel. N-bit digital signals are loaded into ladder 400 such that each of superconducting loops 401-404 receives a respective one of the N bits. For example, ladder 400 may receive a 4-bit digital signal. In a classical electrical circuit, such digital bits may be represented by voltages. However, in a superconducting circuit, such digital bits may be represented by magnetic flux quanta. Thus, while a classical resistor ladder may implement voltage-divider circuits, ladder 400 implements a superconducting analogue in the form of flux-divider circuits.

In operation, the individual bits of a 4-bit digital signal are each loaded into a respective one of superconducting loops 401-404. However, because superconducting loops 401-404 are connected in parallel, the individual bit signals are consequently shared between adjacent superconducting loops. In this signal-sharing, only a portion of the magnetic flux contained within a given superconducting loop 401-404 is administered to an adjacent superconducting loop. For example, superconducting loop 401 may receive one full magnetic flux quantum as a representation of a single digital bit from a 4-bit digital signal. Superconducting loop 401 may also receive portions of the magnetic flux quanta that are distributed to superconducting loops 402-404 from the other bits of the same 4-bit digital signal. In this manner, the discrete magnetic flux quanta that make up a 4-bit digital signal are combined into one analog signal in superconducting loop 401 of ladder 400, from whence they are administered to, for example, a programmable device 430.

As shown in FIG. 4, each superconducting loop 401-404 in ladder 400 contains a serially coupled or "longitudinal" superconducting inductor $L_L$ (411-414) and a parallelly coupled or "transverse" superconducting inductor $L_T$ (421-424). The degree of signal-sharing among superconducting loops 401-404 is governed by the magnitudes of these inductances. Specifically, the ratios of the magnitudes of the various serial or longitudinal superconducting inductors 411-414 and parallel or transverse superconducting inductors 421-424 influence how a data signal is administered between the superconducting loops 401-404. This ratio-based signal distribution may be achieved in a manner that is similar in some respects to the well-understood administration of non-superconducting data signals throughout a classical resistor ladder circuit.

In accordance with the present systems, methods and apparatus a superconducting demultiplexer circuit may be adapted to administer digital signals to a superconducting inductor ladder circuit. In some embodiments, this is achieved by at least one flux storage structure that is configured to store digital flux signals from the individual switching cells in the last (or bottom) row of the demux circuit and couple these signals to at least one superconducting loop in a superconducting inductor ladder circuit. The present systems, methods and apparatus describe a flux storage structure that is particularly well adapted for use with individual switching cell 300 from FIG. 3.

Figure 5:
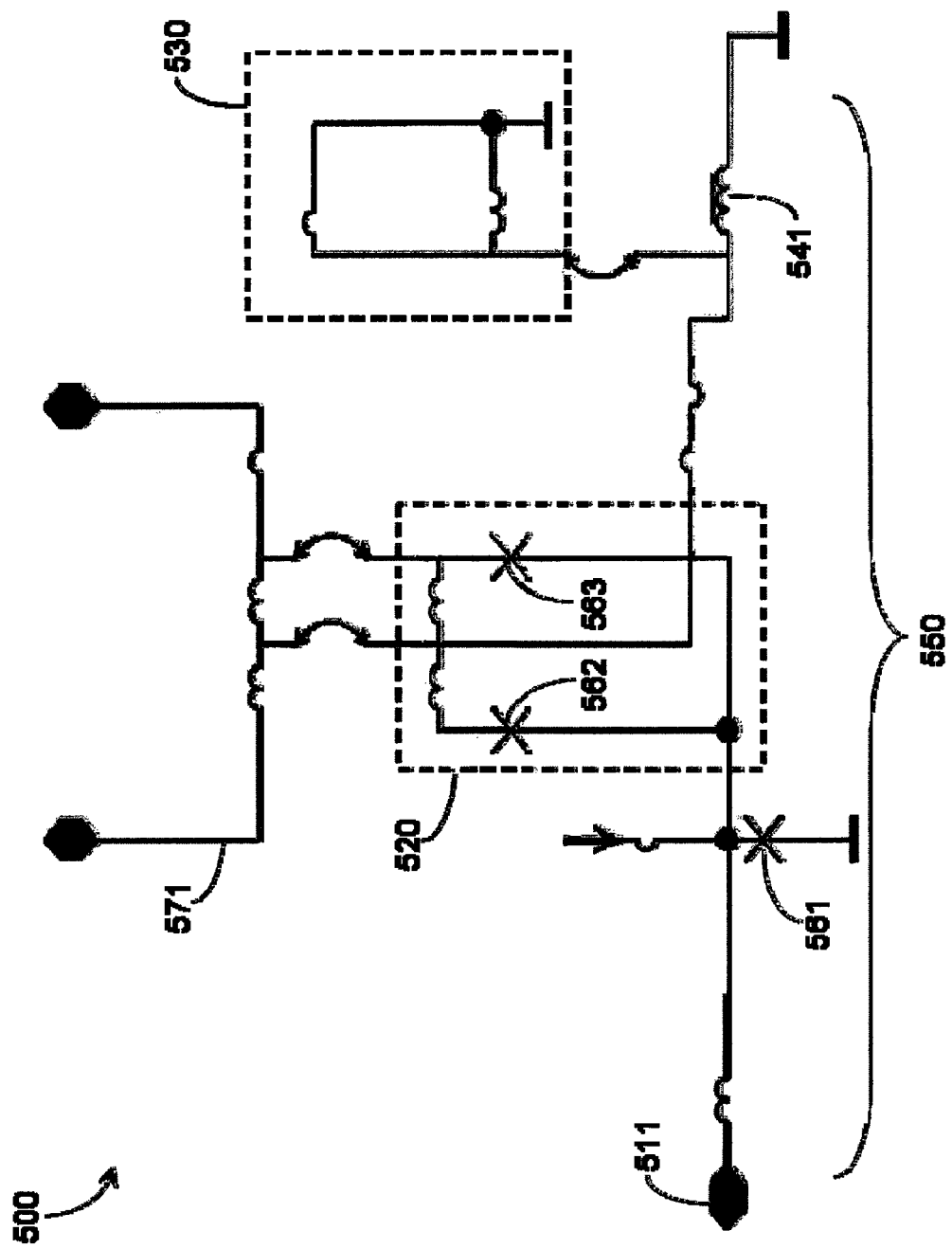
FIG. 5 is a schematic diagram of an embodiment of a flux storage structure designed for use with the individual switching cell from FIG. 3.

FIG. 5 is a schematic diagram of an embodiment of a flux storage structure 500 designed for use with individual switching cell 300 from FIG. 3. Flux storage structure 500 includes input 511 which connects to an output (i.e., 321 or 322) of an individual switching cell 300. Input 511 of flux storage structure 500 begins with JTL 550 which is an extension of the JTL 350 at either output 321 or 322 of cell 300. Flux storage structure 500 may be viewed as a short JTL 550 that is interrupted by a compound Josephson junction 520 and terminates with a large inductor 541. In some embodiments, inductor 541 is superconducting. JTL 550 includes at least one Josephson junction 561 that releases an output pulse when an input signal is received at input 511. An output pulse released by Josephson junction 561 is stored in inductor 541, which is sufficiently large to hold at least one or multiple magnetic flux quanta. In this way, multiple input signals at input 511 may each produce a respective output pulse from Josephson junction 561 and all of these pulses may be combined and stored in inductor 541. The flux stored in inductor 541 may be controllably "reset" or "erased" by activating reset line 571. Current that is selectively passed through reset line 571 is coupled to compound Josephson junction 520, causing both Josephson junctions 562, 563 to switch (both Josephson junctions switch because the superconducting loop that forms compound Josephson junction 520 has insufficient inductance to hold a whole flux quantum) and release output pulses. Thus, the flux stored in inductor 541 may be reset/erased through the application of one or more steps using reset line 571. In some embodiments, inductor 541 may be inductively coupled to a superconducting loop 530, which may be a superconducting loop (e.g., any of loops 401-404) of a superconducting inductor ladder circuit 400.

Throughout this specification, the term "bit" is frequently used to refer to a specific data signal. Traditionally, the term "bit" implies a "binary digit" that is embodied in a single unit of information (e.g., a 1 or a 0). The data signals administered in the present systems, methods and apparatus may be embodied by multiple units of information (e.g., multiple magnetic flux quanta) and are not limited to binary states. In the present systems, methods and apparatus, the term "bit" is used for analogous convenience only.

Figure 6:
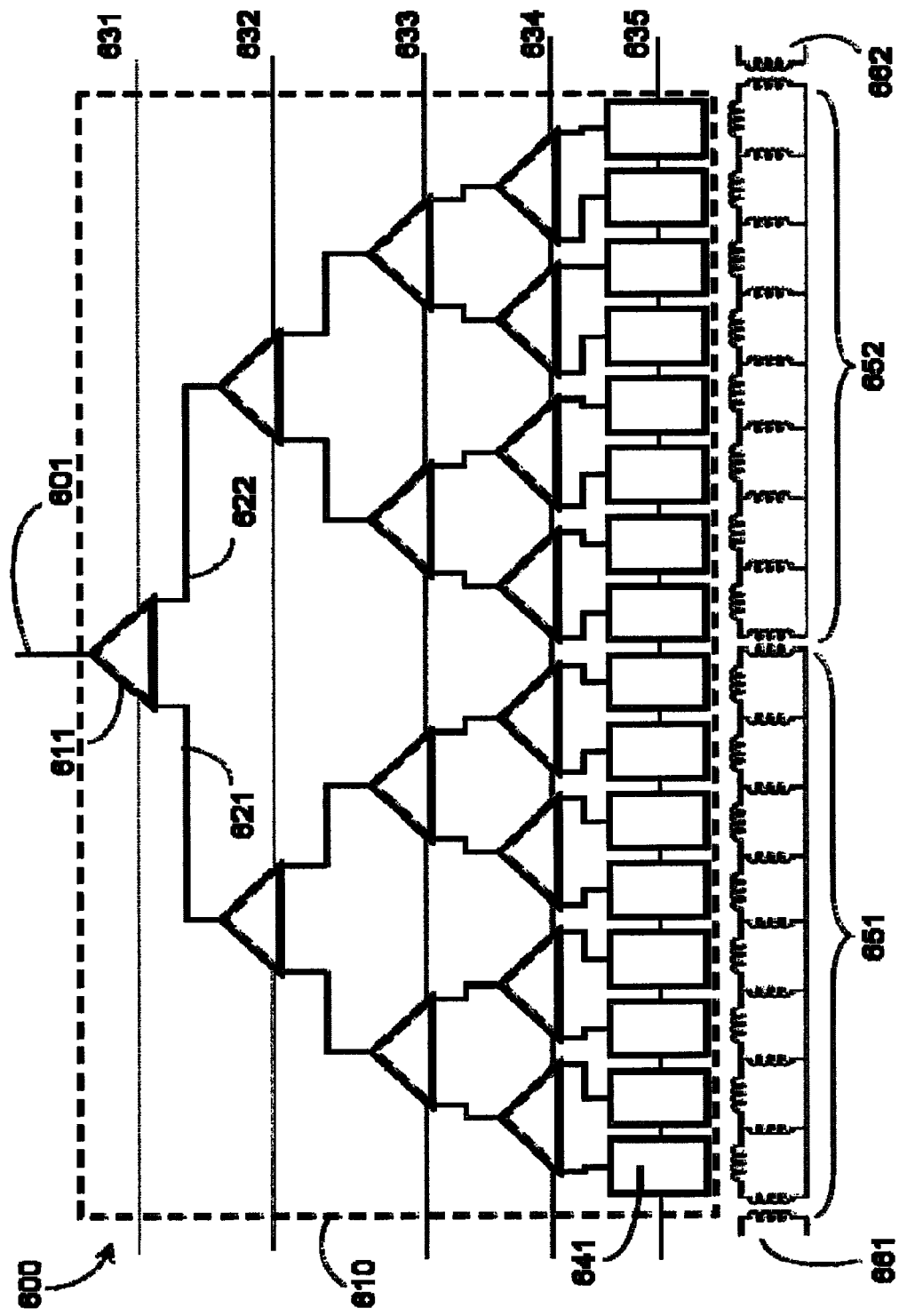
FIG. 6 is a schematic diagram of an embodiment of a demultiplexer digital-to-analog conversion system for use in programming the elements of a superconducting processor.

In some embodiments of the present systems, methods and apparatus, a demux 100 comprising a plurality of switching cells 300 may terminate with a plurality of flux storage structures 500 that are configured to communicate with at least one digital-to-analog converter such as ladder 400. In this way, the logarithmic addressing achievable with a demux circuit may be used to provide multi-bit control signals to the elements of a superconducting quantum processor. FIG. 6 is a schematic diagram of an embodiment of a demux-digital-to-analog conversion ("DAC") system 600 for use in programming the elements of a superconducting processor, such as a superconducting quantum processor. Demux-DAC system 600 includes an input signal line 601 that leads into a demux circuit (demarcated by the broken line box) 610. Demux circuit 610 includes fifteen individual switching cells 611 (only one called out in the Figure), where each switching cell 611 may be substantially similar to switching cell 300 from FIG. 3. The fifteen switching cells 611 are arranged in four rows 631-634 to form a binary tree, though those of skill in the art will appreciate that any number of switching cells may be implemented in any of a wide variety of arrangements. Regardless of the geometrical arrangement of switching cells 611, each switching cell 611 has two output signal lines 621, 622 and one input signal line 601. In demux circuit 610, each of the two output signal lines 621, 622 of the lead switching cell in row 631 feeds directly into the input signal line of a respective switching cell in row 632; each of the two output signal lines of each respective switching cell in row 632 feeds directly into the input signal line of a respective switching cell in row 633; and each of the two output signal lines of each respective switching cell in row 633 feeds directly into the input signal line of a respective switching cell in row 634.

Demux circuit 610 is configured to couple digital flux signals to at least one digital-to-analog converter, such as ladder 400 from FIG. 4. To this end, the two outputs of each switching cell in row 634 each connect directly to an input of a respective flux storage structure 641 (only one called out in the Figure) in row 635. Row 635 includes sixteen flux storage structures 641, though those of skill in the art will appreciate that other embodiments may employ any number of flux storage structures. In some embodiments, the number of flux storage structures 641 is approximately equal to twice the number of switching cells 611 in the second to last row 634 of demux circuit 610. In demux circuit 610, each flux storage structure 641 is substantially similar to flux storage structure 500 from FIG. 5. Demux-DAC system 600 also includes two superconducting inductor ladder circuits 651, 652 and each flux storage structure 641 is inductively coupled to a respective superconducting loop in at least one of ladders 651 and 652.

Demux-DAC system 600 includes two ladders 651 and 652, each of which includes eight superconducting loops. However, those of skill in the art will appreciate that any number of ladders may similarly be used, and a ladder may include any number of superconducting loops. For example, alternative embodiments of demux-DAC system 600 may include four ladders, each of which includes four superconducting loops with each loop being inductively coupled to a respective flux storage structure 641. As an alternative example to illustrate the flexibility of the design, demux-DAC system 600 may include three flux storage structures 641 that are coupled to one ladder with three superconducting loops, seven flux storage structures 641 that are coupled to one ladder with seven superconducting loops, five flux storage structures 641 that are coupled to one ladder with five superconducting loops, and a single flux storage structure 641 that is coupled to a single superconducting loop. Each ladder 651, 652 in demux-DAC system 600 may couple an analog signal to at least one programmable device 661, 662, such as an element of a superconducting quantum processor. In some embodiments, a plurality of ladders may couple to the same programmable device. In some embodiments, a single ladder may couple to a plurality of programmable devices.

In operation, any particular path that corresponds to the routing of an input signal from the lead switching cell 611 in row 631 of demux-DAC system 600 to a particular flux storage structure 641 in row 635 effectively realizes a continuous JTL that passes through a compound Josephson junction 520 and terminates with a large inductor 541. Demux-DAC system 600 therefore includes a plurality of power input nodes (e.g., power input nodes 351-355 in cell 300 of FIG. 3). In some embodiments, all of these power input nodes may be connected to the same power input line (not shown in the Figures). In other embodiments, the coupling of power to the power input nodes may be distributed over a plurality of power input lines (not shown in the Figures). The particular routing through this continuous JTL is determined by the flux bias lines (e.g., flux bias line 331) coupled to the switching cells 611 in each row 631-634 (not shown in FIG. 6). Thus, a set of digital magnetic flux quanta may be routed through demux-DAC system 600 and stored in the large inductors 541 of the flux storage structures 641 in the last row 635 of the demux circuit 610. These digital magnetic flux signals may be coupled to at least one ladder 651, 652 where they are combined to form an analog signal that is coupled to a programmable device, such as an element of a superconducting quantum processor. The stored flux may then be reset (or erased) by the reset line 571 coupled to the compound Josephson junction 520 of each flux storage structure 641, or by routing negative flux quanta through the circuit.

The number of control lines in demux-DAC system 600 includes the number of rows in demux circuit 610 plus the single input signal line 601. Each of rows 631-634 includes a respective flux bias line (e.g., flux bias line 331) and row 635 includes a reset line (e.g., reset line 571). However, in some embodiments it may be possible to accommodate more control lines, in which case separate control lines may be used to provide flux biases to switching cells 611 and reset lines to flux storage structures 641 as desired. Those of skill in the art will appreciate that a modulated input signal from input signal line 601 may be synchronized with respective modulated flux bias signals to each of rows 631-634 to quickly load any combination or permutation of digital magnetic flux quanta to flux storage structures 641 and, in some embodiments, ladders 651, 652.

Figure 7:
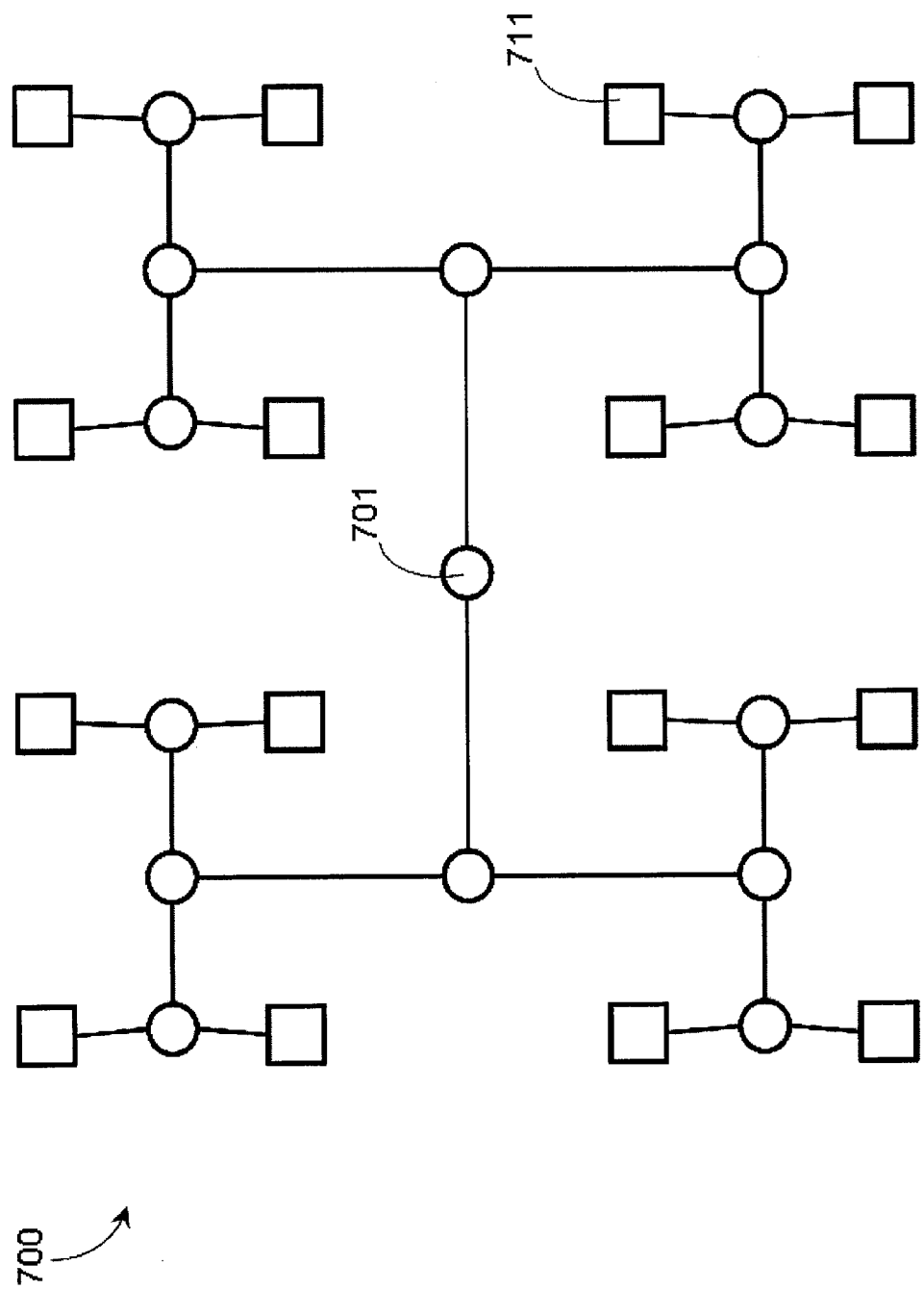
FIG. 7 is a schematic diagram of an embodiment of a demultiplexer circuit arranged in an H-tree layout.

Those of skill in the art will appreciate that the actual layout of a demux circuit and/or a demux-DAC system may differ from the layouts shown in FIGS. 1, 2, and 6. The layouts used in these Figures are for illustrative purposes only, while in practice a layout may be adapted to accommodate a wide range of specifications. For example, in some embodiments a demux circuit (and therefore a demux-DAC system) may be arranged in an "H-tree" layout. FIG. 7 is a schematic diagram of an embodiment of a demux circuit 700 arranged in an H-tree layout. In FIG. 7, each individual switching cell 701 (only one called out in the Figure) is represented by a circle and each flux storage structure 711 (only one called out in the Figure) is represented by a square. Thus, demux circuit 700 includes fifteen switching cells 701 and sixteen flux storage structures 711. In some embodiments, flux storage structures 711 may be coupled to ladder circuits (e.g., ladder 400) similar to as shown in demux-DAC system 600 from FIG. 6. The H-tree layout realizes a binary-tree type arrangement similar to the layout of rows shown in FIGS. 1 and 2. That is, each switching cell 701 in the H-tree layout has a first input channel which branches into two output channels. As with any other arrangement, those of skill in the art will appreciate that the H-tree layout of demux circuit 700 may be adapted to accommodate any number of switching cells 701 and flux storage structures 711.

While the embodiments of JTL-based demux circuits described herein are particularly useful in many applications, the present systems, methods and apparatus also describe an alternative set of embodiments of demux circuits for which DC power input is not required. The embodiments of demux circuits in this second set are based on quantum flux parametron-type devices referred to herein as "latching qubits." Full details of the structure and operation of latching qubits are provided in U.S. patent application Ser. No. 12/109,847. A brief overview of these devices is now provided.

In some embodiments, a latching qubit may comprise a qubit loop formed by a loop of superconducting material and a compound Josephson junction ("CJJ") that interrupts the qubit loop, where the CJJ is formed by a loop of superconducting material that is interrupted by at least two Josephson junctions. The concept of latching in classical electrical circuits is well known in the art. Throughout this specification and the appended claims, to "latch" a superconducting signal refers to the process of loading an instantaneous signal, retaining the instantaneous signal despite perturbations or evolutions in the source signal, and continuously outputting the instantaneous signal until the latching is quenched. The latching operation of a latching qubit is controlled by a clock signal that is inductively coupled to the CJJ of the latching qubit. In some embodiments, whenever the clock signal pulses, the latching qubit loads an input signal that is inductively coupled to the qubit loop of the latching qubit, holds that instantaneous signal, and transmits it to an output (for example, another device that is inductively coupled to the qubit loop of the latching qubit) for the duration of the clock pulse.

Those of skill in the art will appreciate that the term "latching qubit" is used herein to describe a quantum flux parametron-type device that may, as introduced in U.S. patent application Ser. No. 12/109,847, be implemented as a fundamental circuit component or logic device. A latching qubit may be similar in structure to a superconducting flux qubit, though it is generally not operated as a quantum binary digit.

Figure 8:
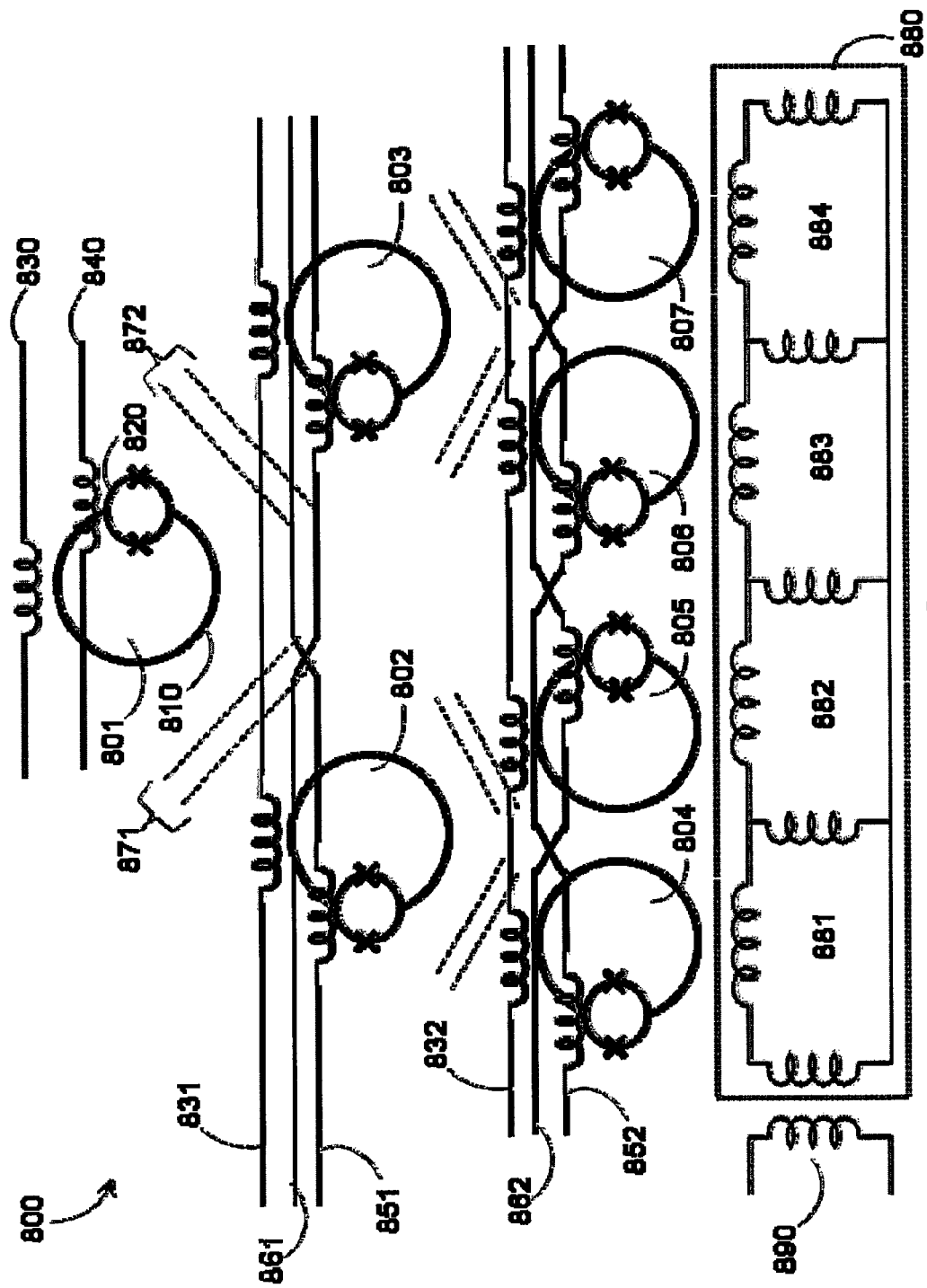
FIG. 8 is a schematic diagram of an embodiment of a demultiplexer-digital-to-analog conversion circuit that implements latching qubits as the individual switching cells.

The present systems, methods and apparatus describe embodiments of demux circuits (similar to demux 100 from FIG. 1) that use latching qubits as the fundamental switching cells (e.g., cell 101). FIG. 8 is a schematic diagram of an embodiment of a demux-DAC circuit 800 that implements latching qubits 801-807 as the individual switching cells. Each latching qubit 801-807 comprises a qubit loop 810 (only one called out in the Figure) formed by a loop of superconducting material and a CJJ 820 (only one called out in the Figure) that interrupts the qubit loop, where the CJJ is formed by a loop of superconducting material that is interrupted by at least two Josephson junctions (represented by respective crosses in the Figure). Demux-DAC 800 includes seven latching qubits 801-807 arranged in three rows to form a binary tree similar to demux 100 from FIG. 1. However, those of skill in the art will appreciate that any number of latching qubits may similarly be employed in a wide variety of layouts, including the H-tree layout shown in FIG. 7.

Throughout this specification and the appended claims, the term "lead latching qubit" is used to refer to the first latching qubit that is configured to couple to the input signal source in a demux circuit comprising latching qubits.

In the illustrated embodiment, the qubit loop 810 of the lead latching qubit 801 is inductively coupled to a signal input line 830 and the CJJ 820 of the lead latching qubit 801 is inductively coupled to a clock input line 840. By using clock input line 840 to inductively couple a clock signal to the CJJ 820, lead latching qubit 801 can controllably latch an input signal applied to the qubit loop 810 through input signal line 830. Lead latching qubit 801 has two effective outputs (similar in concept to outputs 121 and 122 of demux 100 from FIG. 1) which are realized by respective inductive couplings 871, 872 (represented by broken diagonal lines in FIG. 8) to latching qubits 802 and 803, respectively, in the second row of demux-DAC 800. An input signal latched by lead latching qubit 801 may therefore be routed to latching qubit 802 at the left in FIG. 8 and/or to latching qubit 803 at the right in FIG. 8. The CJJ of latching qubit 802 (the "leftward" latching qubit in the second row of demux-DAC 800) is inductively coupled to a first clock signal line 851. Similarly, the CJJ of latching qubit 803 (the "rightward" latching qubit in the second row of demux-DAC 800) is inductively coupled to a second clock signal line 861. First clock signal line 851 and second clock signal line 861 (rightward-routing in Figure) are used to selectively route the input signal from lead latching qubit 801 to leftward latching qubit 802 and rightward latching qubit 803, respectively. Furthermore, the qubit loops of both latching qubits 802, 803 in the second row of demux-DAC 800 are inductively coupled to the same control line 831. In some embodiments, control line 831 may be activated with a control signal that is opposite in sign and smaller in magnitude than the signal that is to be latched from latching qubit 801 to leftward latching qubit 802 and/or rightward latching qubit 803. In some embodiments, the control signal line in the second row of a demux circuit comprising latching qubits (e.g., control signal line 831 in FIG. 8) may be omitted.

When an input signal is applied to input signal line 830, the input signal may be selectively latched by lead latching qubit 801 by accordingly varying the clock signal applied through clock signal line 840. In some embodiments, lead latching qubit 801 "blocks" (i.e., does not transmit) the input signal from input line 830 while the clock signal in clock line 840 is high. In such embodiments, the input signal from input line 830 is latched by lead latching qubit 801 when the clock signal in clock line 840 steps down. When the input signal is latched by lead latching qubit 801, it may then be transmitted to at least one of latching qubits 802 and 803 in the second row of demux-DAC 800. However, similar to the operation of lead latching qubit 801, latching qubits 802 and 803 may each either latch/transmit this signal or block the transmission of this signal. Whether a signal is latched/transmitted or blocked by a particular latching qubit is controlled by the clock signal coupled to the CJJ of the particular latching qubit. Thus, a first clock signal line 851 (leftward in Figure) may be used to latch/transmit an input signal from lead latching qubit 801 to leftward latching qubit 802 and a second clock signal line 861 (rightward in Figure) may be used to latch/transmit an input signal from lead latching qubit 801 to rightward latching qubit 803.

From leftward latching qubit 802 in the second row of demux-DAC 800, an input signal may be latched in the third row of demux-DAC 800 by leftward latching qubit 804 and/or by rightward latching qubit 805. Similarly, from rightward latching qubit 803 in the second row of demux-DAC 800, an input signal may be latched in the third row of demux-DAC 800 by leftward latching qubit 806 and/or by rightward latching qubit 807. To take advantage of the logarithmic addressing offered by demux circuits in general, all leftward latching qubits in the same row of demux-DAC 800 may be coupled to a third clock signal line (leftward in Figure) and all rightward latching qubits in the same row of demux-DAC 800 may be coupled to a fourth clock signal line (rightward in Figure). For example, leftward latching qubits 804 and 806 are both coupled to a third clock signal line 852 (leftward in Figure) and rightward latching qubits 805 and 807 are both coupled to a fourth clock signal line 862 (rightward in Figure). As an example, an input signal may be routed from lead latching qubit 801 to latching qubit 805 by using the first clock signal line 851 and the fourth clock signal line 862 to trigger latching in latching qubits 802 and 805, respectively. In the illustrated embodiment of FIG. 8, the first clock signal line 851 and the third clock signal line 852 are both used to route an input signal in a leftward direction. Thus, throughout the rest of this specification and the appended claims, first clock signal line 851 and third clock signal line 852 are said to be included in the same first set of clock signal lines. Similarly, the second clock signal line 861 and the fourth clock signal line 862 are both used to route an input signal in a rightward direction. Thus, throughout the rest of this specification and the appended claims, second clock signal line 861 and fourth clock signal line 862 are said to be included in the same second set of clock signal lines The behavior of a latching qubit is such that, when a latching operation is triggered, either a positive or a negative signal will be latched. In some embodiments, the magnitude of the latched signal is a characteristic of the latching qubit itself and may generally be the same for a given latching qubit (or a given combination of device parameters) regardless of the sign or magnitude of the input signal. The "state" of a latching qubit may therefore be generalized as being positive, zero, or negative. The act of triggering a latching operation may cause a latching qubit to latch into either a positive or a negative state depending on whether the majority of the input signal that it "sees" is positive or negative. If no input signal is present when a latching operation is triggered, then a latching qubit may still latch into a positive or negative state. This means that a latching qubit that is not included in a particular routing path but that shares a clock signal line with a latching qubit that is included in the particular routing path may still have its latching mechanism triggered by a clock signal in the shared clock signal line. For example, in routing an input signal from lead latching qubit 801 to latching qubit 805 as described above, clock signal line 862 (from the second set of clock signal lines) is used to trigger a latching operation in latching qubit 805. However, clock signal line 862 is also inductively coupled to latching qubit 807 and therefore a latching operation is simultaneously triggered in latching qubit 807. In this example, there is no input signal latched in latching qubit 803, and therefore there is no input signal seen by latching qubit 807 when its latching operation is triggered by clock signal line 862. When a latching operation is triggered in latching qubit 807, either a positive or a negative signal will be latched even though there is no input signal being coupled to latching qubit 807 from latching qubit 803. For this reason, control lines 831 and 832 are used in the second and third rows of demux-DAC 800 to couple a control signal to latching qubits 802-803 and 804-807, respectively. In some embodiments, the control signal may be opposite in sign than the input signal and smaller in magnitude than the signal that is latched by a latching qubit.

Control lines 831 and 832 may each provide a small signal of known sign that may be latched by latching qubits that are not included in a particular routing path when their latching operation is triggered by a shared clock signal line. In some embodiments, this known sign is opposite to the sign of the input signal. In the exemplary routing path from lead latching qubit 801 to latching qubit 805 described above, the input signal may be of a first sign (e.g., positive). This input signal may be latched by latching qubit 802 as controlled by clock signal line 851 (from the first set of clock signal lines). The latched signal in latching qubit 802 may then be latched by latching qubit 805 as controlled by clock signal line 862. During this second latching operation, a latching operation is simultaneously triggered in latching qubit 807 because latching qubits 805 and 807 are two rightward latching qubits in the same row of demux-DAC 800 and therefore, in this embodiment, they are coupled to the same latching clock signal line 862. In some embodiments, a control signal of a second sign (e.g., negative) that is opposite to the sign of the input signal may be applied through control line 832. This control signal is coupled to each of latching qubits 804-807 in the third row of demux-DAC 800 and provides a known signal to be latched by latching qubits whose latching operation is triggered even though they are not in the particular routing path (e.g., latching qubit 807). Thus, latching qubit 807 latches a control signal of magnitude A from control line 832 when latching qubit 805 latches a signal of magnitude B from latching qubit 802. In this embodiment, it is preferred that A<B because the control signal is also seen by latching qubits that are in the particular routing path (e.g., latching qubit 805). The signal that is ultimately latched by latching qubit 805 is the same sign as that output by latching qubit 802 because the magnitude of the signal that is output by latching qubit 802 (B) is greater than the magnitude of the control signal (A) from control line 832. Thus, if latching qubit 805 latches a positive signal of magnitude B and control line 832 couples a negative signal of magnitude A to latching qubits 805 and 807, where $|A|<|B|$, then using clock signal line 862 to trigger rightward routing in the third row of demux-DAC 800 may cause latching qubit 805 to latch a positive signal whose magnitude depends on the parameters of latching qubit 805 (latching qubit 805 "sees" a positive input because $B-A>0$), while latching qubit 807 simultaneously latches a negative signal whose magnitude depends on the parameters of latching qubit 807 (latching qubit 807 only "sees" a negative input, A). In some embodiments, all or a portion of the control lines (e.g., control lines 831 and 832) in a demux circuit based on latching qubits (e.g., demux-DAC 800) may be coupled together in series.

In some embodiments of demux-DAC 800 an input signal of a first sign (e.g., positive) may be routed through a binary tree type network of latching qubits towards a particular latching qubit in the last row of the network. In some embodiments, control signals of a second sign (e.g., negative) may simultaneously be routed through the binary tree type network of latching qubits and be distributed among at least one latching qubit, and in some instances a plurality of latching qubits, in the last row of the network.

In some embodiments of demux-DAC 800, the signal(s) latched by the at least one latching qubit 804-807 in the last row of the binary tree type network of latching qubits may be loaded directly to at least one programmable device, such as an element of a superconducting quantum processor. In some embodiments of demux-DAC 800, the signal(s) latched by the at least one latching qubit 804-807 in the last row of the binary tree type network of latching qubits may be loaded into a digital-to-analog converter such as the ladder 880 shown in FIG. 8. In the illustrated embodiment, each latching qubit 804-807 in the last row of demux-DAC 800 is inductively coupled to a respective superconducting loop 881-884 in ladder 880. As previously described, the digital outputs of latching qubits 804-807 may be combined in ladder 880 to produce an analog signal that is administered to, for example, a programmable device 890.

In general, various forms of demux circuits are known in the art. The various embodiments of demux circuits described herein, however, are constructed using newly developed devices (e.g., switching cell 300 and latching qubit 801) as the individual switching cells. Some embodiments are also specifically adapted (e.g., using flux storage structures 500) to provide digital bits of information to a superconducting flux-based DAC, such as a superconducting inductor ladder circuit. In this way, embodiments of demux circuits that are particularly well-suited to realize the benefits of logarithmic addressing in programming the elements of a superconducting processor, such as a superconducting quantum processor, have been developed. Furthermore, the present systems, methods and apparatus address a common problem associated with many forms of demux circuits: due to the binary-tree type layout of switching devices, if one device fails to work properly then all those devices that branch down from the failed device will be affected and, in the worst case scenario, will be completely unusable.

Figure 9:
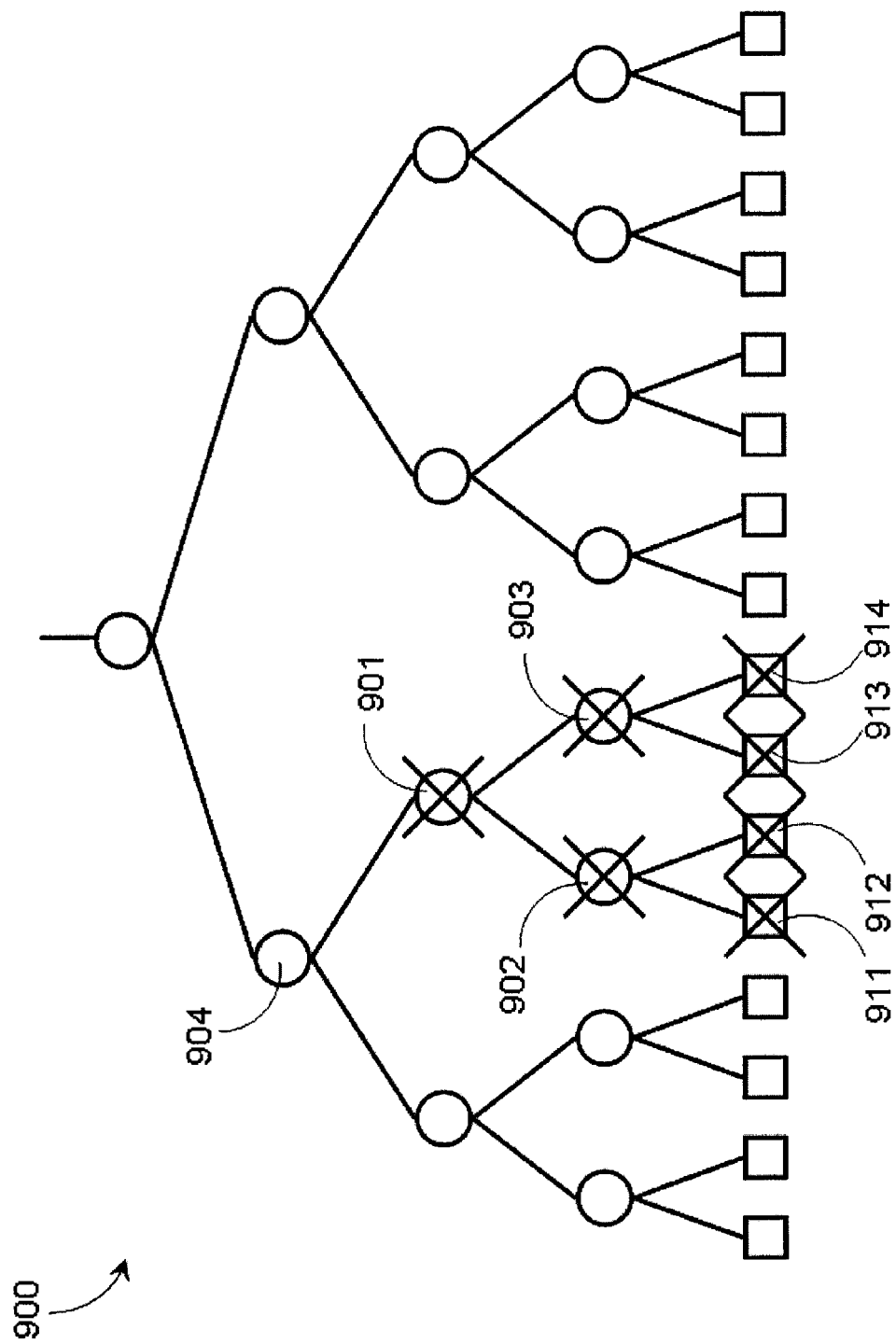
FIG. 9 is an illustrative diagram of a typical demultiplexer circuit in which a single switching cell is faulty.

FIG. 9 is an illustrative diagram of a typical demux circuit 900 in which a single switching cell 901 is faulty. Demux 900 includes fifteen switching cells, though those of skill in the art will appreciate that any number of devices may similarly be used. In the embodiment shown in FIG. 9, switching cell 901 is faulty and cannot be used to transmit an input signal to either switching cell 902 or switching cell 903. As a consequence, switching cells 902 and 903 cannot be used to route input signals to devices 911-914. Such a scenario may occur if there has been some inconsistency or failure in the fabrication process of demux 900. For example, if switching cells 901-903 are realized using switching cell 300 from FIG. 3, such a failure may occur if the fabricated Josephson junctions do not behave according to specification. In typical demux circuits, a failure such as that illustrated in FIG. 9 may result in a significant reduction in the programming ability of the circuit. As described above, a failure in one switching cell in demux 900 (e.g., switching cell 901) renders the entire demux circuit incapable of routing programming signals to all of the devices (e.g., 911-914) that connect to the failed switching cell 901. In the illustrated embodiment, twenty-five percent of the devices in the last row of demux 900 are rendered un-programmable due to a failure in one switching cell 901. In fact, the effect of "cascaded error" due to a device failure in a demux circuit becomes more detrimental when the failure occurs in a higher row of the circuit. Throughout this specification, the term "cascaded error" is used to describe the situation in which an error in one device has an adverse effect on all of those devices that branch therefrom. For example, if switching cell 904 completely fails in a manner similar to that described for switching cell 901 in demux 900, then fifty percent of the devices in the last row of demux 900 may be rendered un-programmable. Thus, it is clear that the implementation of a demux circuit does carry an associated risk that is particularly dependent on the performance of switching cells in the higher rows of the circuit.

There are varying modes and degrees of failure that may be introduced among the switching cells of a demux circuit. For example, the cascaded error illustrated in demux 900 may be realized by a complete failure (resulting in zero signal transmission) in switching cell 901. Similarly, the cascaded error illustrated in demux 900 may be realized by a "one-way" failure in switching cell 904, such that switching cell 904 is only capable of leftward switching and not rightward switching. If cell 904 is realized by switching cell 300 from FIG. 3, then this sort of one-way failure may result if there is an inconsistency in at least one of Josephson junctions 363 or 364, or some other asymmetrical error in JTL 350.

The present systems, methods and apparatus provide a mechanism for reducing the risk of cascaded error in demux circuits. This mechanism utilizes, at least in part, the fact that each switching cell is designed to route a signal to one of two directions (e.g., leftward or rightward), and that when a routing step in a particular row is activated in a first direction (e.g., leftward) then the routing step in the particular row is not activated in a second direction (e.g., rightward). Thus, a rightward output from a first switching cell in a first row of a demux circuit may be directed to the input of a particular switching cell in a second row of a demux circuit, and a leftward output from a second switching cell in the first row of a demux circuit may be directed to the input of the same particular switching cell in the second row of the demux circuit. In this situation, only one switching cell from the first row will communicate with the switching cell in the second row for any given routing step when leftward and rightward steps are not activated simultaneously. It is noted that as used herein and in the claims, the term "row" may sometimes be used to describe a hierarchical ordering or level in a hierarchy, without specifying any specific geometrical layout. An example of such is illustrated in the embodiment of an H-tree layout.

Figure 10:
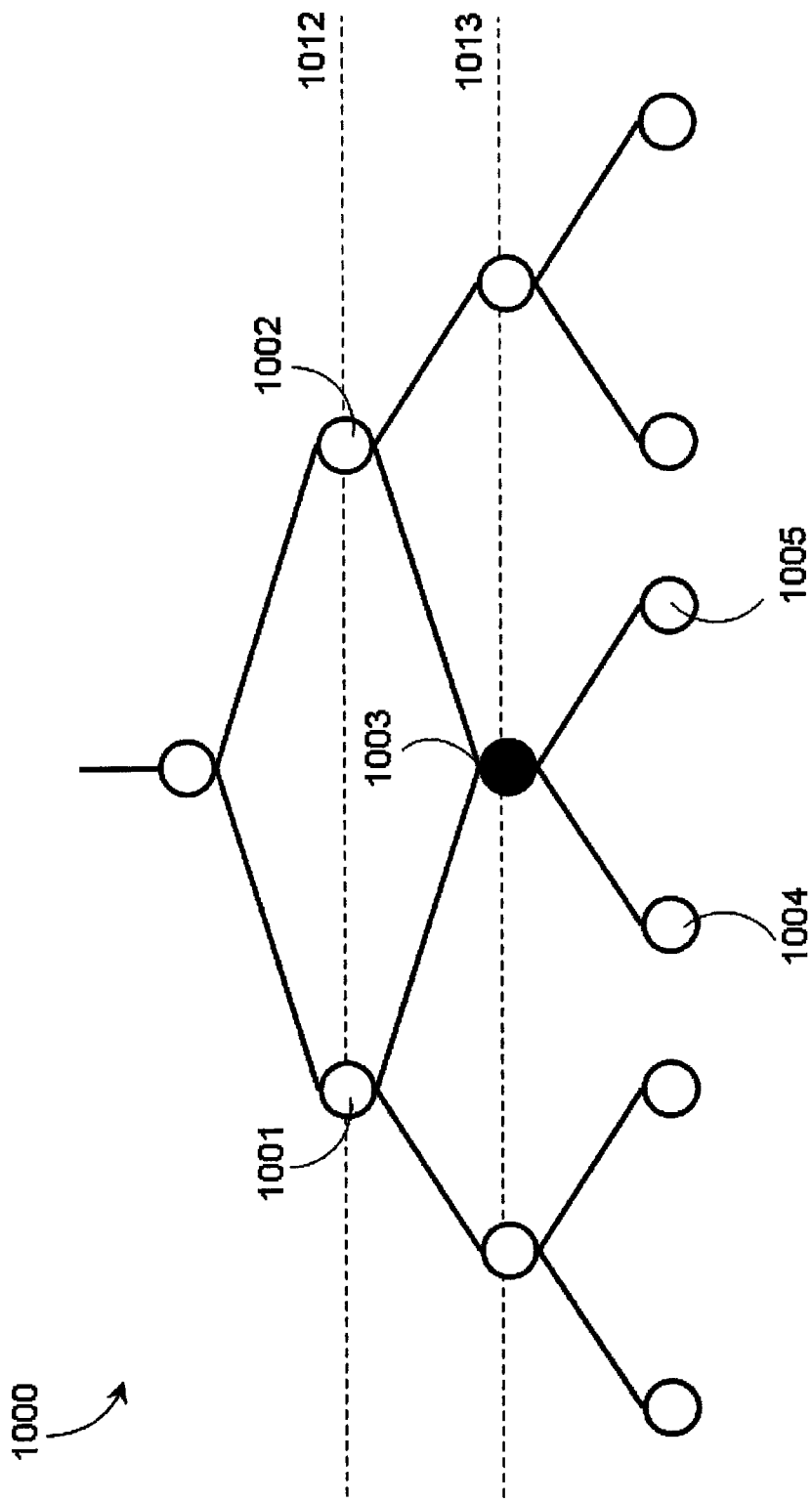
FIG. 10 is a schematic diagram of an embodiment of a demultiplexer circuit that includes a mechanism for reducing the risk of cascaded error.
Figure 11:
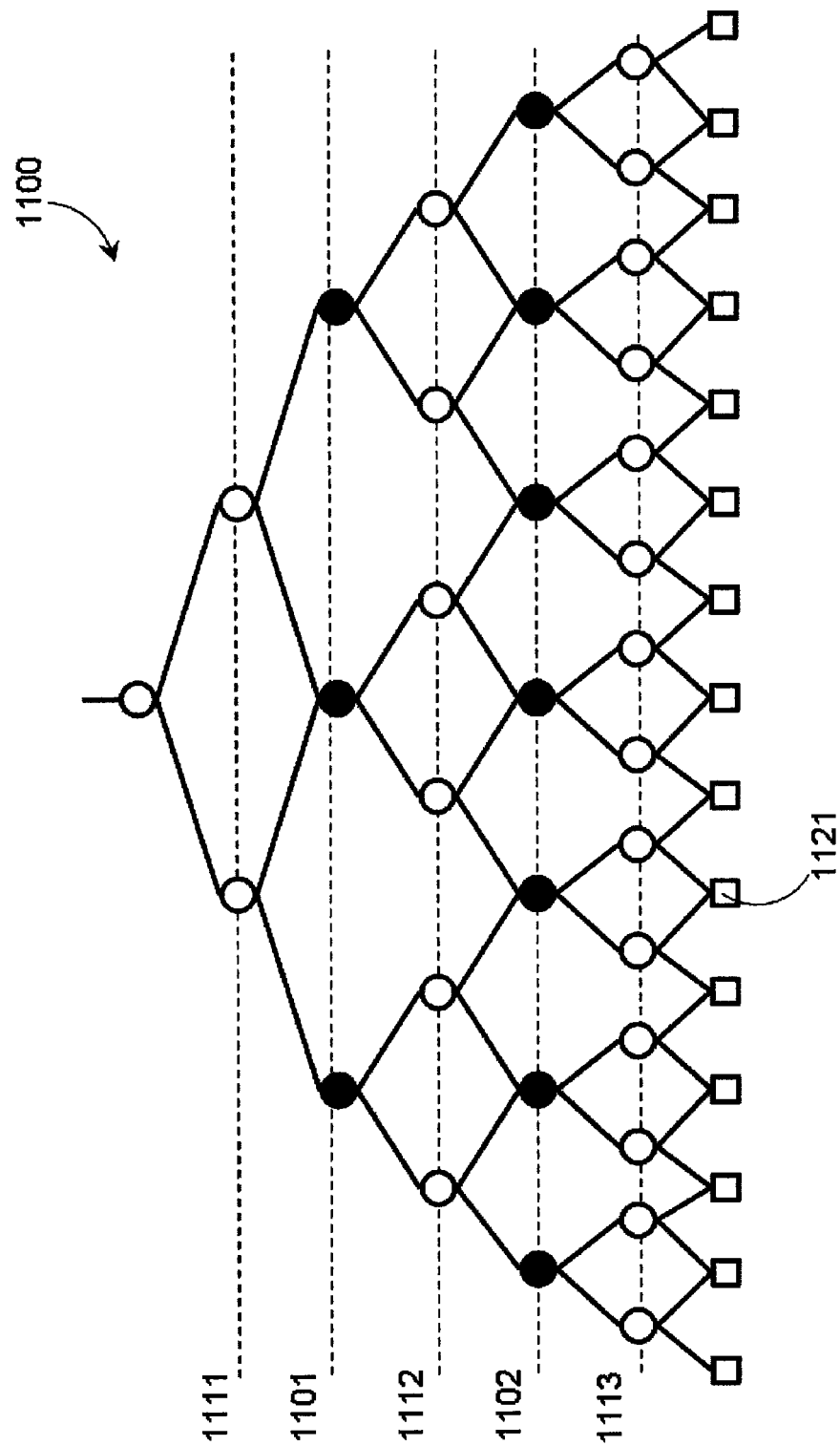
FIG. 11 is a schematic diagram of an embodiment of a buffered demultiplexer circuit that includes buffer rows for reducing the risk of cascaded error.
Figure 12:
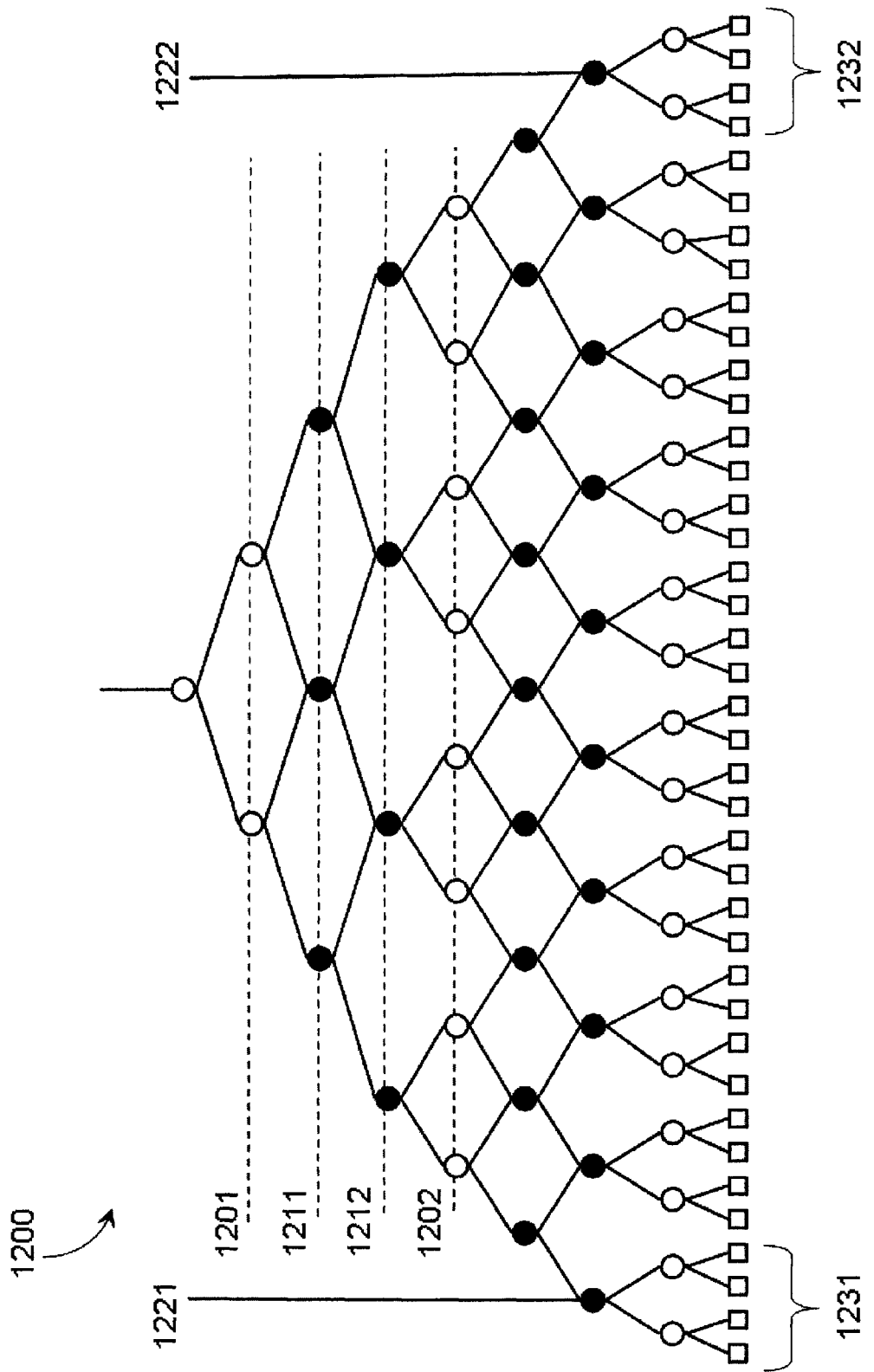
FIG. 12 is a schematic diagram of an embodiment of another buffered demultiplexer circuit that includes buffer rows for reducing the risk of cascaded error.

FIG. 10 is a schematic diagram of an embodiment of a demux circuit 1000 that includes a mechanism for reducing the risk of cascaded error. In demux 1000, switching cell 1003 in row 1013 is selectively coupled to both switching cells 1001 and 1002 in row 1012. A routing path may lead to switching cell 1003 along a rightward routing step from switching cell 1001 or along a leftward step from switching cell 1002. In this way, those cells/devices (e.g., 1004 and 1005) that are connected beneath switching cell 1003 may be reached by two independent routing paths. If switching cell 1002 ceases to transmit signals or becomes unable to rout signals in a leftward direction, then cells/devices 1004 and 1005 may still be reached by a rightward routing step from switching cell 1001. Similarly, if switching cell 1001 ceases to transmit signals or becomes unable to route signals in a rightward direction, then cells/devices 1004 and 1005 may still be reached by a leftward routing step from switching cell 1002. Throughout this specification and the appended claims, a switching cell whose input is connected to multiple cell outputs (e.g., switching cell 1003 in demux 1000) is referred to as a "buffer cell" and a row of buffer cells is referred to as a "buffer row." A buffer row provides alternative paths to connect switching cells in a first row (above the buffer row) to switching cells in a second row (below the buffer row), thereby reducing the risk of cascaded errors in a demux circuit. In FIGS. 10-12, buffer cells are filled in black for clarity.

FIG. 11 is a schematic diagram of an embodiment of a buffered demux circuit 1100 that includes buffer rows 1101, 1102 for reducing the risk of cascaded error. In demux circuit 1100, buffer rows 1101 and 1102 are each located in between a respective pair of "doubling rows" 1111, 1112 and 1112, 1113 respectively. Throughout this specification and the appended claims, the term "doubling row" is used to refer to a row of switching cells in a demux circuit that includes approximately twice as many cells as the previous row (i.e., the row above), thereby realizing the logarithmic scaling of the binary tree type layout. By incorporating at least one buffer row in demux 1100, any given device in the last row of the circuit may be reached by alternative, redundant routing paths. In this way, the risk of cascaded error due to a failure in a switching cell is mitigated. For example, from FIG. 11 it is apparent that device 1121 may be reached by several combinations of leftward/rightward routing steps throughout the rows of demux 1100. Even though the implementation of at least one buffer row in a demux circuit does increase the average number of control lines per number of switching cells in the circuit, the average number of control lines does still scale logarithmically with the number of switching cells in the circuit.

Demux 1100 includes alternating doubling rows and buffer rows (i.e., the rows are ordered as: 1111, 1101, 1112, 1102, 1113), though those of skill in the art will appreciate that other schemes may be employed if desired. For example, in some embodiments the risk of cascaded errors may be even further mitigated by incorporating a greater number of buffer rows into the demux circuit. FIG. 12 is a schematic diagram of another embodiment of a buffered demux circuit 1200 that includes buffer rows for reducing the risk of cascaded error. In demux circuit 1200, pairs of buffer rows are located in between respective adjacent doubling rows. For example, two buffer rows 1211, 1212 are located in between adjacent doubling rows 1201, 1202. Increasing the number of buffer rows in between adjacent doubling rows increases the number of alternative redundant routing paths through the demux circuit, while maintaining logarithmic scaling of the number of control lines.

In demux circuit 1200, only devices 1231 and 1232 (collectively) are not coupled to redundant alternative routing paths. These devices can only be reached if every switching cell in their respective routing paths functions properly. In some embodiments, a redundant alternative routing path may be provided for these sets of devices by using independent control lines 1221 and 1222.

The concept of buffer rows taught herein may be appropriate in many applications. However, the implementation of buffer rows throughout an entire demux circuit does greatly increase the number of devices within the circuit, which can increase the likelihood of device failure. Those of skill in the art will appreciate that alternative routing paths may similarly be realized simply by implementing two complete and distinct demux circuits that are both coupled to the same set of programmable devices. In some embodiments of the present systems, methods and apparatus, it is therefore preferred to use buffer cells and/or buffer rows only in the higher rows of a demux circuit where cascaded errors can have the greatest impact. For example, in some embodiments it may be preferred to incorporate buffer rows only in the top three quarters, two thirds, one half, one third, or one quarter (etc. . . . ) of a demux circuit.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other superconducting computing systems, not necessarily the exemplary superconducting quantum computing systems generally described above.

Typically, the switching cells allow signals to be routed along two (or more) different branches. These branches may be denominated in any convenient fashion, for example as "A" and "B" or "0" and "1", "right" and "left", etc. The description and claims may denominate these branches by reference to specific directions, for example right and left. However, those terms, and similar such terms, are only for convenience of explanation and are based on the particular illustration, unless the context makes clear otherwise. For example, the terms "leftward" and "rightward" may be used to explain branching as illustrated in a particular figure. Such does not mean, and is not meant to imply, that any specific direction is necessary. Nor does such mean or is meant to imply that diametrically opposed directions are necessary. Rather, such is simply a convenient way of referring to a branching path direction, which could of course have been otherwise denoted.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to U.S. Provisional Patent Application Ser. No. 61/058,494, filed Jun. 3, 2008 and entitled "Systems, Methods and Apparatus for Superconducting Demultiplexer Circuits"; US Patent Publication No. 2006-0225165; US Patent Publication 2008-0176750; U.S. patent application Ser. No. 12/266,378; PCT Patent Application Serial No. PCT/US09/37984; US Patent Publication 2008-0215850; US Patent Publication 2009-0082209; and U.S. patent application Ser. No. 12/109,847, are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A superconducting demultiplexer comprising:
a plurality of switching cells that includes a lead switching cell, a first set of switching cells, and a second set of switching cells, wherein each switching cell in the plurality of switching cells comprises:
a signal input end, a first signal output end and a second signal output end;
a first Josephson transmission line having a first end and a second end, wherein the first end of the first Josephson transmission line is coupled to the signal input end;
a second Josephson transmission line having a first end and a second end, wherein the first end of the second Josephson transmission line is coupled to the first signal output end and the second end of the second Josephson transmission line is coupled to the second output end, and wherein the second end of the first Josephson transmission line is coupled to the second Josephson transmission line at an intersection node; and
a flux bias line that is positioned to inductively couple signals to both a first node and a second node on the second Josephson transmission line, wherein the first node on the second Josephson transmission line is located in between the intersection node and the first output end, and wherein the second node on the second Josephson transmission line is located in between the intersection node and the second output end;
wherein the input end of the lead switching cell is configured to receive signals from an input signal source, the first output end of the lead switching cell is coupled to the input end of a first switching cell from the first set of switching cells, the second output end of the lead switching cell is coupled to the input end of a second switching cell from the first set of switching cells, the first and the second output ends of both the first and the second switching cells in the first set of switching cells are each coupled to the input end of another respective switching cell in the first set of switching cells, and wherein the input end of each switching cell in the second set of switching cells is coupled to a respective output end of a switching cell in the first set of switching cells.

2. The superconducting demultiplexer of claim 1 wherein at least one output end of at least one switching cell in the second set of switching cells is configured to couple to a programmable device.

3. The superconducting demultiplexer of claim 2 wherein the programmable device includes an element of a superconducting processor.

4. The superconducting demultiplexer of claim 3 wherein the programmable device includes an element of a superconducting quantum processor.

5. The superconducting demultiplexer of claim 2 wherein the programmable device is selected from the group consisting of: a superconducting flux qubit, a superconducting phase qubit, a superconducting charge qubit, a superconducting hybrid qubit, and a superconducting qubit coupler.

6. The superconducting demultiplexer of claim 1, further comprising:
a set of flux storage structures, wherein each flux storage structure is coupled to a respective output end of at least one switching cell in the second set of switching cells, and wherein each flux storage structure comprises:
a third Josephson transmission line that includes a first end and a second end, the first end coupled to an output end of at least one switching cell in the second set of switching cells;
a storage inductor coupled in series with the third Josephson transmission line;
a compound Josephson junction that interrupts the third Josephson transmission line at a node that is located in between the first end and the storage inductor; and
a reset line that is positioned to controllably inductively couple signals to the compound Josephson junction.

7. The superconducting demultiplexer of claim 6 wherein at least one storage inductor is positioned to inductively couple signals to at least one programmable device.

8. The superconducting demultiplexer of claim 6 wherein at least one storage inductor is positioned to inductively couple signals to at least one superconducting loop in a superconducting inductor ladder circuit.

9. The superconducting demultiplexer of claim 8 wherein at least two storage inductors are each respectively positioned to inductively couple signals to respective ones of at least two loops in a superconducting inductor ladder circuit.

10. The superconducting demultiplexer of claim 9 wherein the superconducting inductor ladder circuit is positioned to couple signals to at least one programmable device.

11. The superconducting demultiplexer of claim 10 wherein the at least one programmable device includes an element of a superconducting processor.

12. The superconducting demultiplexer of claim 11 wherein the at least one programmable device includes an element of a superconducting quantum processor.

13. The superconducting demultiplexer of claim 12 wherein the at least one programmable device is selected from the group consisting of: a superconducting flux qubit, a superconducting phase qubit, a superconducting charge qubit, a superconducting hybrid qubit, and a superconducting qubit coupler.

14. The superconducting demultiplexer of claim 1 wherein the same flux bias line is positioned to controllably inductively couple signals to at least two switching cells.

15. A superconducting demultiplexer comprising:
a plurality of latching qubits that includes a lead latching qubit, a first set of latching qubits, and a second set of latching qubits, wherein each latching qubit in the plurality of latching qubits comprises a qubit loop formed by a loop of material that is superconducting below a critical temperature, and a compound Josephson junction that interrupts the qubit loop, the compound Josephson junction comprising a loop of material that is superconducting below a critical temperature that is interrupted by at least two Josephson junctions;
a first set of clock signal lines;
a second set of clock signal lines; and
at least one control line, wherein each latching qubit in the first and the second sets of latching qubits is positioned to receive signals by inductive coupling to a control line;
wherein the lead latching qubit is positioned to receive signals from an input signal source, a first latching qubit in the first set of latching qubits is positioned to inductively couple to the qubit loop of the lead latching qubit and a first clock signal line from the first set of clock signal lines is positioned to controllably inductively couple to the compound Josephson junction of the first latching qubit in the first set of latching qubits, a second latching qubit in the first set of latching qubits is positioned to inductively couple to the qubit loop of the lead latching qubit and a first clock signal line from the second set of clock signal lines is positioned to controllably inductively couple to the compound Josephson junction of the second latching qubit in the first set of latching qubits; and wherein the qubit loop of each latching qubit in the first set of latching qubits is respectively positioned to inductively couple to the qubit loop of three other latching qubits in the plurality of latching qubits, the compound Josephson junction of a first proportion of latching qubits from the first set of latching qubits is positioned to inductively couple to a clock signal line from the first set of clock signal lines, the compound Josephson junction of a second proportion of latching qubits from the first set of latching qubits is positioned to inductively couple to a clock signal line from the second set of clock signal lines, the qubit loop of each latching qubit in the second set of latching qubits is positioned to inductively couple to the qubit loop of a respective one of the latching qubits in the first set of latching qubits, the compound Josephson junction of a first proportion of latching qubits in the second set of latching qubits is positioned to inductively couple to a clock signal line from the first set of clock signal lines, and the compound Josephson junction of a second proportion of latching qubits in the second set of latching qubits is positioned to inductively couple to a clock signal line from the second set of clock signal lines.

16. The superconducting demultiplexer of claim 15 wherein the qubit loop of at least one latching qubit in the second set of latching qubits is configured to couple to a programmable device.

17. The superconducting demultiplexer of claim 16 wherein the programmable device includes an element of a superconducting processor.

18. The superconducting demultiplexer of claim 17 wherein the programmable device includes an element of a superconducting quantum processor.

19. The superconducting demultiplexer of claim 18 wherein the programmable device is selected from the group consisting of: a superconducting flux qubit, a superconducting phase qubit, a superconducting charge qubit, a superconducting hybrid qubit, and a superconducting qubit coupler.

20. The superconducting demultiplexer of claim 15 wherein at least two latching qubits in the first set of latching qubits are positioned to inductively couple to a same one of the clock signal lines from the first set of clock signal lines.

21. The superconducting demultiplexer of claim 20 wherein at least two latching qubits in the first set of latching qubits are positioned to inductively couple to a same one of the clock signal lines from the second set of clock signal lines.

22. The superconducting demultiplexer of claim 15 wherein the first proportion of latching qubits in the first set of latching qubits is approximately fifty percent, the second proportion of latching qubits in the first set of latching qubits is approximately fifty percent, the first proportion of latching qubits in the second set of latching qubits is approximately fifty percent, and the second proportion of latching qubits in the second set of latching qubits is approximately fifty percent.

23. The superconducting demultiplexer of claim 15 wherein the qubit loop of at least one latching qubit in the second set of latching qubits is positioned to inductively couple to at least one superconducting loop in a superconducting inductor ladder circuit.

24. The superconducting demultiplexer of claim 23 wherein the qubit loops of at least two respective latching qubits in the second set of latching qubits are positioned to each inductively couple to a respective one of at least two superconducting loops in a superconducting inductor ladder circuit.

25. The superconducting demultiplexer of claim 24 wherein the superconducting inductor ladder circuit is positioned to couple signals to at least one programmable device.

26. The superconducting demultiplexer of claim 25 wherein at least one programmable device includes an element of a superconducting processor.

27. The superconducting demultiplexer of claim 26 wherein at least one programmable device includes an element of a superconducting quantum processor.

28. The superconducting demultiplexer of claim 27 wherein at least one programmable device is selected from the group consisting of: a superconducting flux qubit, a superconducting phase qubit, a superconducting charge qubit, a superconducting hybrid qubit, and a superconducting qubit coupler.

29. A demultiplexer circuit comprising:
a first switching cell including an input end and two output ends;
a first set of additional switching cells, wherein each switching cell in the first set of additional switching cells includes an input end and two output ends and wherein the first set of additional switching cells includes at least one buffer cell; and
an input signal source that is configured to controllably couple input signals to the first switching cell;
wherein the first set of additional switching cells is arranged to substantially form a binary tree such that each output end of each switching cell couples to a respective input end of another switching cell and wherein each input end of each switching cell receives at least one input from at least one output of at least one other switching cell, and wherein the input end of the at least one buffer cell receives one respective output end from each of at least two respective switching cells and the two output ends of the at least one buffer cell each couple to the input end of a respective switching cell.

30. The demultiplexer of claim 29 wherein the first set of additional switching cells is arranged in a set of rows such that at least one row includes at least two buffer cells.

31. The demultiplexer of claim 29 wherein the switching cells are superconducting devices.

32. The demultiplexer of claim 31, further comprising a second set of additional switching cells that each include an input end and two output ends, wherein the input end of each switching cell in the second set of additional switching cells is coupled to at least one respective output end of a respective switching cell from the first set of additional switching cells and at least one output end of at least one switching cell in the second set of additional switching cells is configured to couple to a programmable device.

33. The demultiplexer of claim 32 wherein the programmable device includes an element of a superconducting processor.

34. The demultiplexer of claim 33 wherein the programmable device includes an element of a superconducting quantum processor.

35. The demultiplexer of claim 34 wherein the programmable device is selected from the group consisting of: a superconducting flux qubit, a superconducting phase qubit, a superconducting charge qubit, a superconducting hybrid qubit, and a superconducting qubit coupler.

36. A superconducting demultiplexer circuit comprising:
a network of Josephson transmission lines providing a plurality of superconducting signal paths, wherein each superconducting signal path includes an input end and an output end such that each superconducting signal path shares the same input end and the output end of each superconducting signal path includes a respective compound Josephson junction and a respective superconducting inductor, and wherein each superconducting signal path is positioned to receive control signals by inductive coupling to a plurality of flux bias lines.

37. The superconducting demultiplexer circuit of claim 36 wherein at least one superconducting inductor is positioned to inductively couple to at least one programmable device.

38. The superconducting demultiplexer circuit of claim 36 wherein at least one superconducting inductor is positioned to inductively couple to a superconducting loop in a superconducting inductor ladder circuit.

39. The superconducting demultiplexer circuit of claim 38 wherein each superconducting inductor is positioned to inductively couple to a respective one of the superconducting loops in at least one superconducting inductor ladder circuit.

40. A superconducting demultiplexer circuit comprising:
a binary tree arrangement of superconducting latching qubits wherein each superconducting latching qubit comprises a qubit loop formed by a loop of superconducting material and a compound Josephson junction that interrupts the qubit loop, the compound Josephson junction comprising a closed loop of superconducting material interrupted by at least two Josephson junctions, wherein the qubit loop and the compound Josephson junction form a closed superconducting current path, and wherein the qubit loop of each superconducting latching qubit is positioned to inductively couple at least one input signal and at least two output signals and the compound Josephson junction of each superconducting latching qubit is positioned to receive clock signals by inductive coupling to a clock signal line; and at least one control signal line that is positioned to inductively couple control signals to the respective qubit loops of at least two of the superconducting latching qubits.

* * * * *